United States Patent
Lin et al.

(10) Patent No.: US 6,587,350 B1
(45) Date of Patent: Jul. 1, 2003

(54) EJECTION MECHANISM FOR MODULAR ELECTRONIC ELEMENT

(75) Inventors: Jin Jen Lin, Taipei (TW); Sung Ming Song, Taipei (TW)

(73) Assignee: Inventec Corporation, Taipei (TW)

(*) Notice: Subject to any disclaimer, the term of this patent is extended or adjusted under 35 U.S.C. 154(b) by 0 days.

(21) Appl. No.: 10/146,052

(22) Filed: May 16, 2002

(51) Int. Cl.⁷ .................................................. H05K 5/00
(52) U.S. Cl. ........................ 361/754; 361/801; 439/159; 439/160
(58) Field of Search ................................ 439/159, 160; 361/754, 756, 759, 798, 801

(56) References Cited

U.S. PATENT DOCUMENTS

| | | | |
|---|---|---|---|
| 5,033,972 A | * 7/1991 | Komatsu et al. | 439/153 |
| 5,389,001 A | * 2/1995 | Broschard et al. | 439/159 |
| 5,507,658 A | * 4/1996 | Ho | 439/159 |
| 5,846,096 A | * 12/1998 | Ishida | 439/159 |
| 5,863,212 A | * 1/1999 | Duesterhoeft | 439/160 |
| 5,967,810 A | * 10/1999 | Spickler et al. | 439/159 |
| 6,155,853 A | * 12/2000 | Kajiura | 439/159 |

* cited by examiner

Primary Examiner—David Martin
Assistant Examiner—Thanh S. Phan
(74) Attorney, Agent, or Firm—Jacobson Holman PLLC

(57) ABSTRACT

An ejection mechanism for modular electronic elements is used for ejecting a modular electronic element housed in a housing chamber of an electronic device. The ejection mechanism is located in the housing chamber. By moving only one driving member, the latching relationship of the modular electronic element may be released and the modular electronic element may be ejected out of the housing chamber to facilitate replacement of various types of modular electronic elements.

27 Claims, 29 Drawing Sheets

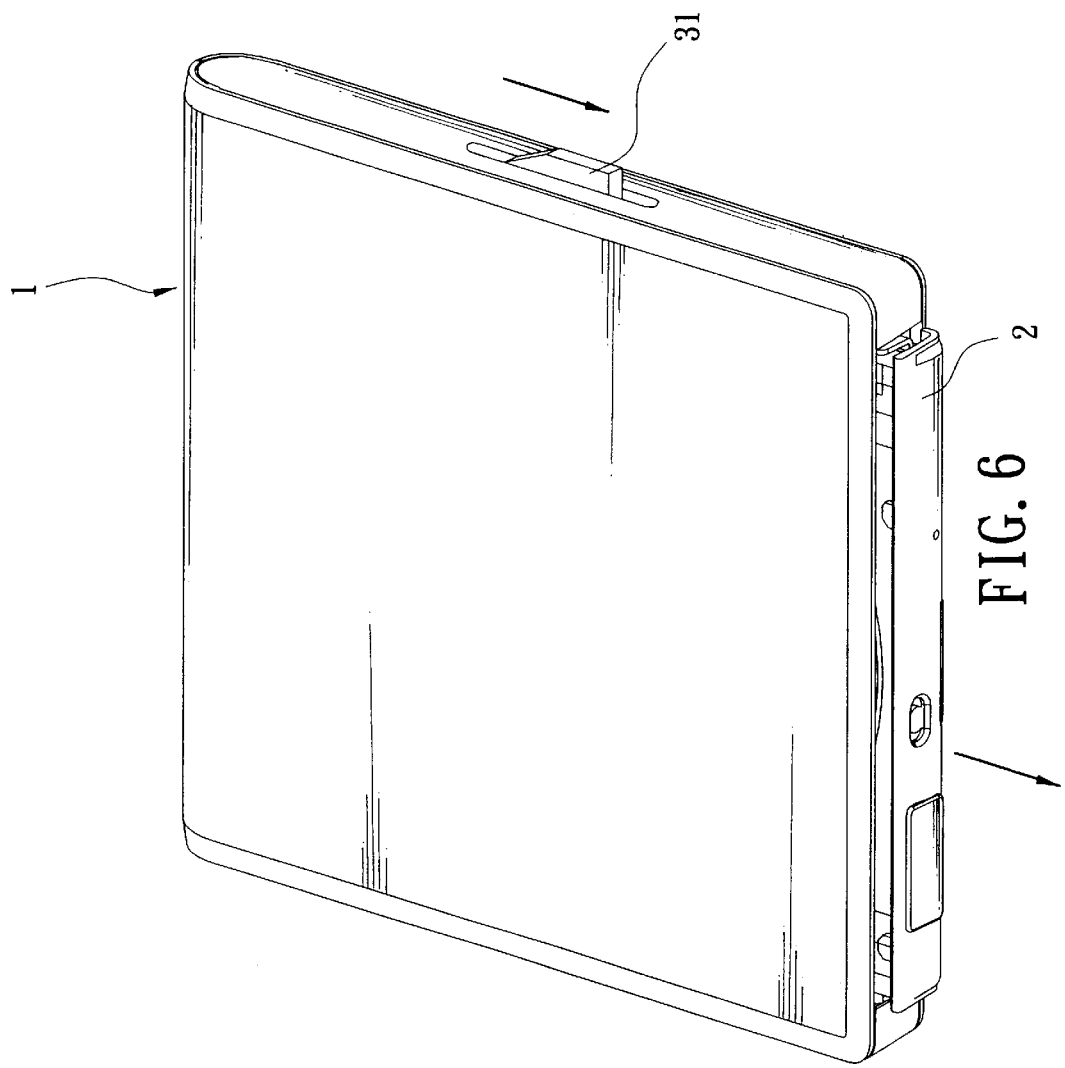

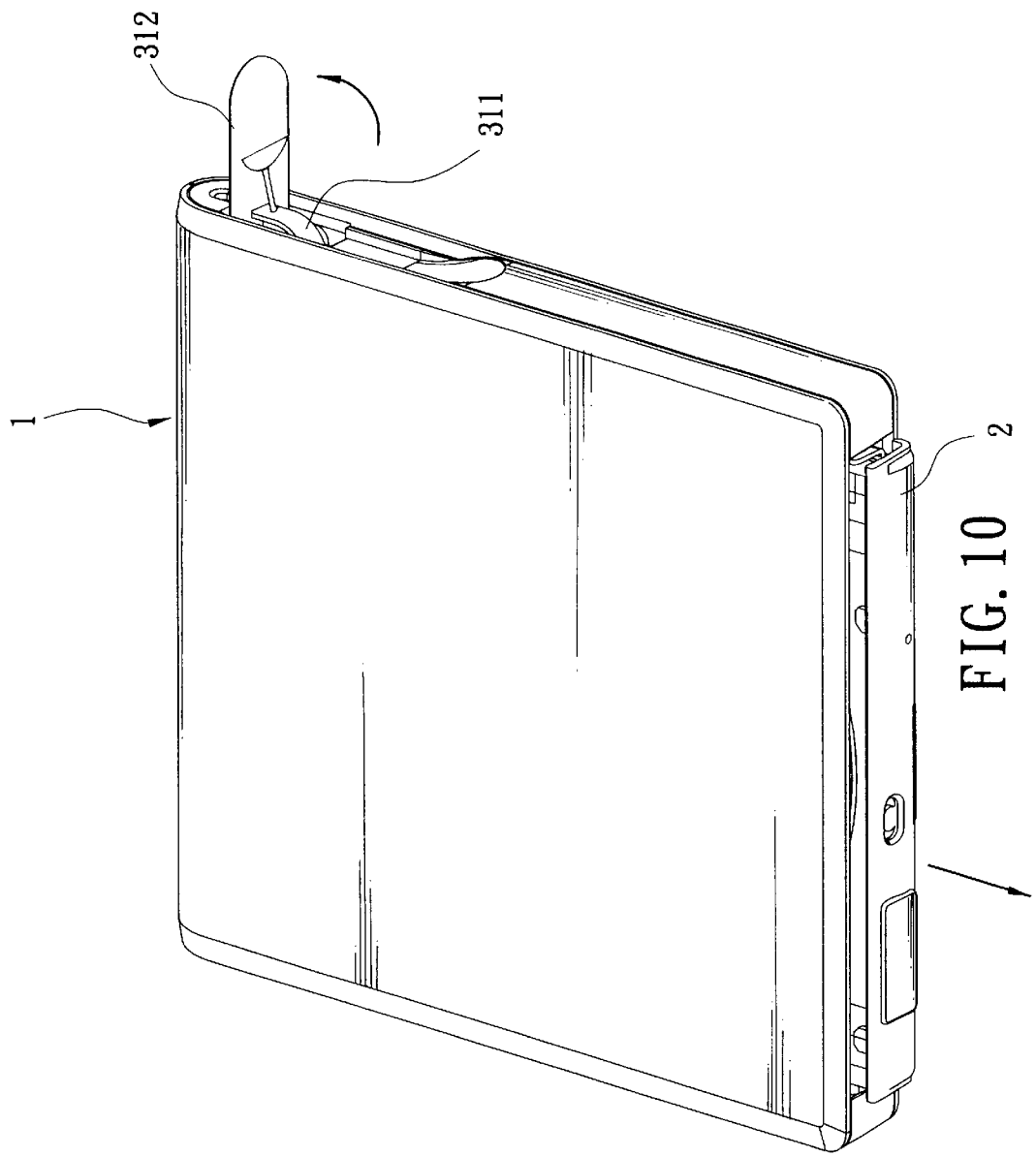

EJECTION MECHANISM FOR MODULAR ELECTRONIC ELEMENT

FIELD OF THE INVENTION

The invention relates to an ejection mechanism adapted for use in a built-in or externally connected housing chamber of an electronic device for ejecting a modular electronic element from the housing chamber.

BACKGROUND OF THE INVENTION

Electronic devices can help people to process and store a large amount of electronic data and have become indispensable products in people's life. With continuous technological development, the functions and speed of electronic products also are improved constantly. Most electronic products have evolved from bulky sizes in the past to slim and light now.

In order to meet storage requirements, a wide variety of disk drives have been developed, such as floppy disk drives, optical disk drives, and the like. Disk drives are the most widely used devices and many different models have been developed. When in use, a specific housing chamber must be provided to hold the disk drive (either built-in or externally connected to the electronic device). As there are different types and sizes of disk drives, it is difficult to house these disk drives in the housing chamber of the electronic device, causing great inconvenience. To resolve this problem, a modular electronic element has been developed. It can be a floppy disk drive or an optical drive, and can be loaded into a housing chamber of electronic devices. The housing chamber usually has an ejection mechanism to eject one modular electronic element to place another one in the housing chamber. For instance, notebook computers generally adopt external disk drives in order to become more slim and light. There are two types of external disk drive. One is directly built in a housing chamber in a notebook computer. The other is in an external box that holds the disk drive separately.

Conventional ejection mechanisms adapted for electronic devices generally include a push rod located on a rear end of the electronic element for removing the electronic element from the connection slot. In order to enable the externally connected electronic element to maintain proper electric connection with the connection slot of the electronic device, the electronic element, in addition to the push rod, usually has a latch element to secure the connection with the connection slot to prevent the electronic element from ejecting accidentally when subject to an external force. The push rod and the latch element are separately designed. When ejecting the electronic element, the latch element must be released first, then the push rod is moved to eject the electronic element. Such a design is not convenient to use.

SUMMARY OF THE INVENTION

The primary object of the invention is to provide an ejection mechanism for modular electronic elements that can easily remove an electronic element from a housing chamber of an electronic device by actuating only one element.

The ejection mechanism according to the invention may be adopted to a built-in or external connecting housing chamber of an electronic device. The mechanism includes a latch member, a first rod member and a second rod member. The latch member is movably located on a lateral side of the housing chamber and has a first wedge surface that has a pointed edge adjacent to the lateral side of the housing chamber, and a latch lug engageable with the electronic element. There is an elastic element located between the latch member and the lateral side of the housing chamber. The first rod member has one lateral side facing the electronic element, and is pivotally engaged with the housing chamber and the second rod member. The second rod member has an ejection member and a second wedge surface corresponding to the first wedge surface. When moving towards the opening of the housing chamber for ejection, the second rod member drives the first rod member to eject the modular electronic element, the second wedge surface pushes the first wedge surface, the latch member is moved to compress the elastic element, and the latch member is released from the modular electronic element.

The foregoing, as well as additional objects, features and advantages of the invention will be more readily apparent from the following detailed description, which proceeds with reference to the accompanying drawings. The drawings are only to serve for reference and illustrative purposes, and are not intended to limit the scope of the invention.

BRIEF DESCRIPTION OF THE DRAWINGS

FIG. 6 is a schematic view of an ejection member located outside the housing chamber and moved by force.

FIG. 10 is a schematic view of an ejection member located outside the housing chamber and moved by force.

DESCRIPTION OF THE PREFERRED EMBODIMENTS

Figure 1:
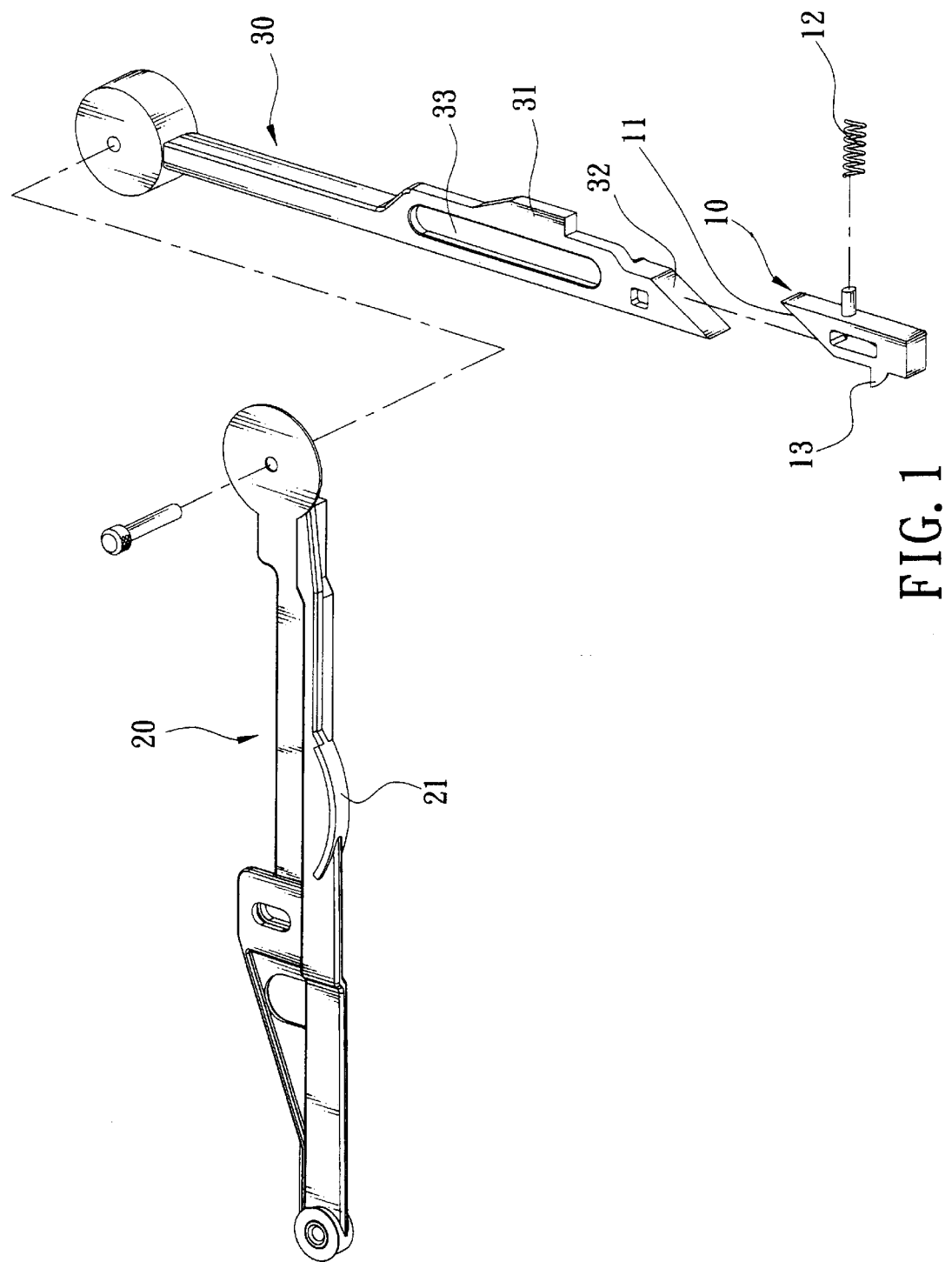
FIG. 1 is exploded view of a first embodiment of the invention.

Refer to FIGS. 1, 2, 3 and 5C for a first embodiment of the ejection mechanism for a modular electronic element of the invention. The ejection mechanism is adopted for use in a housing chamber 1 of an electronic device. The housing chamber 1 may be built in the electronic device or externally connected to the electronic device for housing a modular electronic element 2 (such as a disk drive of various types). The ejection mechanism consists of a latch member 10, a first rod member 20, a second rod member 30 and a retainer 40, and enables the modular electronic element to be easily removed from the housing chamber of the electronic device for replacement.

The latch member 10 is movably located on a lateral side of the housing chamber 1, and has a first wedge surface 11, an elastic element 12, and a latch lug 13. The first wedge surface 11 has a pointed edge adjacent to the lateral side of the housing chamber 1. The elastic element 12 is located between the latch member 10 and the lateral side of the housing chamber 1, and may be a spring. The latch lug 13 engages with the modular electronic element 2 when the latch member 10 is in normal condition.

The first rod member 20 is movably and pivotally located in the housing chamber 1, corresponds to the modular electronic element 2, and has one end pivotally engaging with the second rod member 30. The first rod member 20 further has an ejector 21 located on one side. The ejector 21 is an arch-shaped element extending from the first rod member 20 that corresponds to the modular electronic element 2 (the two may contact with each other, or contact with each other during operation).

The second rod member 30 is movably located in the housing chamber 1 corresponding to the latch member 10, and includes an ejection member 31, a second wedge surface 32 and a slot 33. The ejection member 31 extends outside a lateral side of the housing chamber 1 and forms a linkage relationship with the first rod member 20 and the second rod member 30 for driving the second rod member 30 to move the latch member 10 to release the latch member 10 from the modular electronic element 2. Thus the modular electronic element 2 may be ejected from the housing chamber 1 through the first rod member 20. The second wedge surface 32 corresponds to the first wedge surface 11 (the two may contact with each other, or contact with each other during operation). The slot 33 is an elongated groove for housing a guiding strut 50 to channel and restrict the second rod member 30 to move in a straight direction.

The retainer 40 is located in the housing chamber 1 on one side of the first rod member 20 opposite the modular electronic element 2 to limit the range of motion of the first rod member 20.

Figure 4:
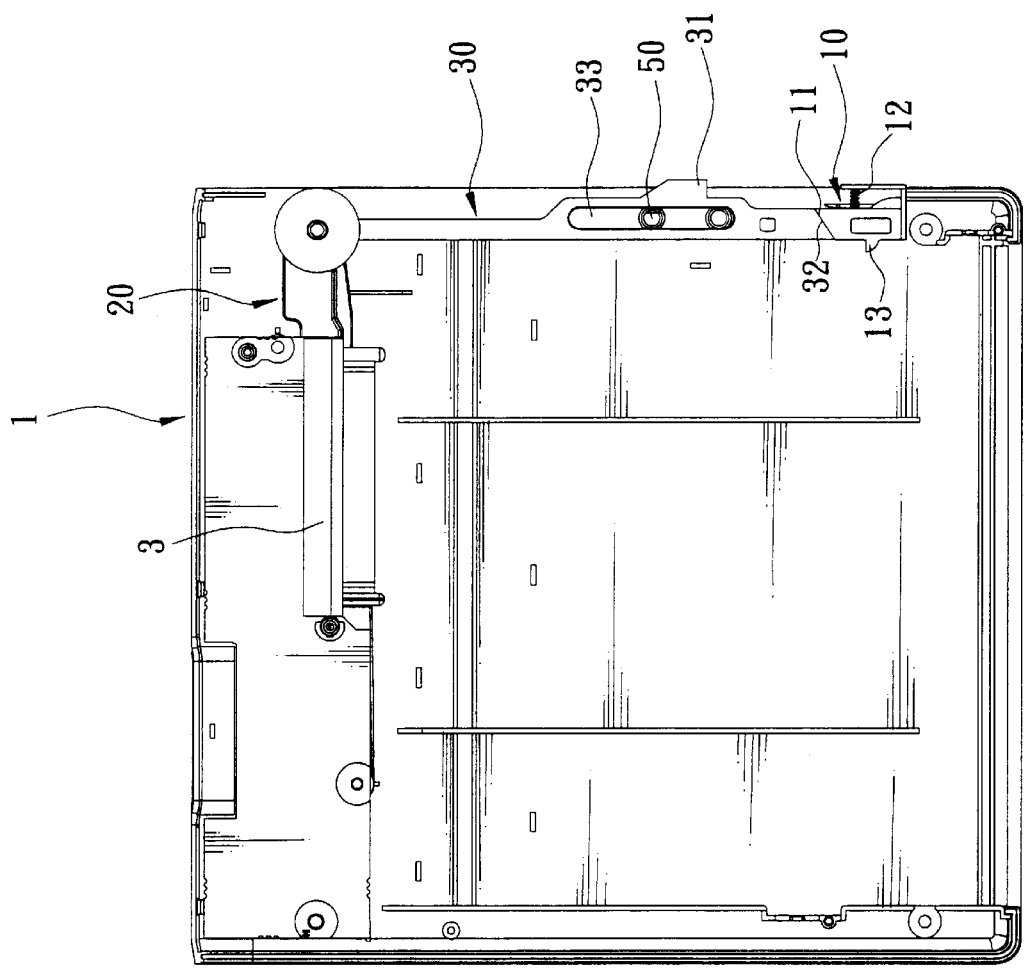
FIG. 4 is a plan view of a housing chamber showing the location of a connection port.
Figure 5A:
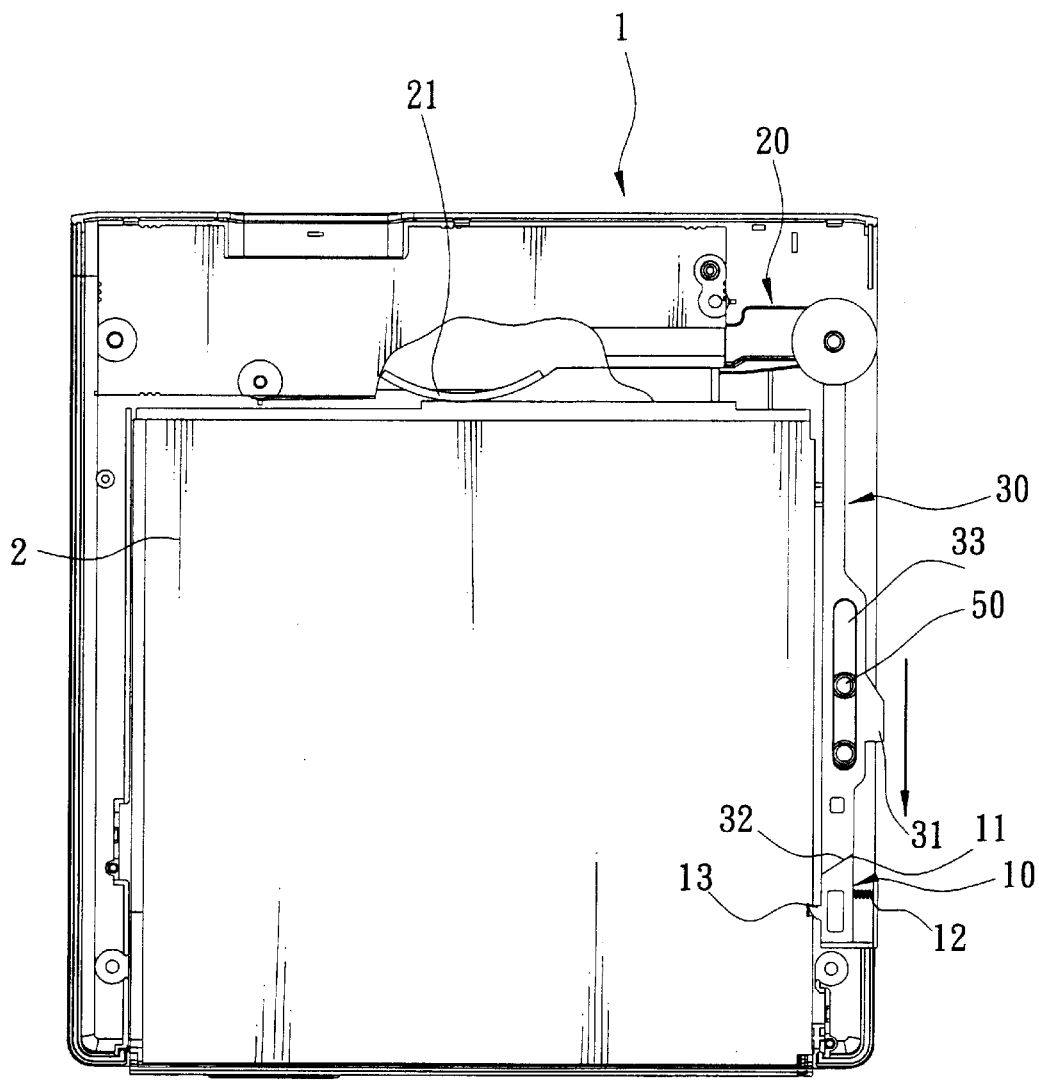
FIGS. 5A, 5B and 5C are schematic views of the first embodiment in various operating conditions, showing a modular electronic element being ejected from the housing chamber.
Figure 5B:
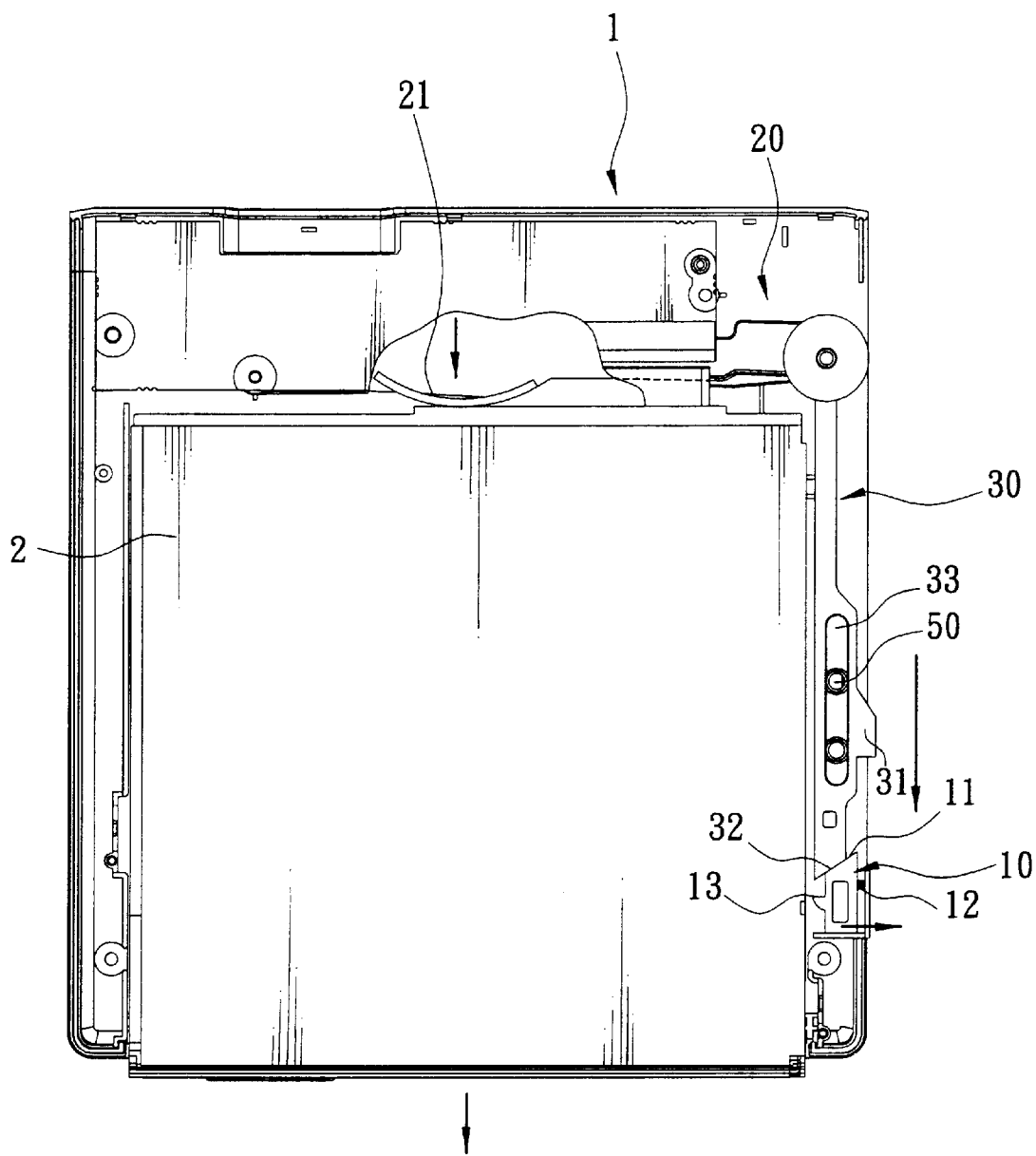
Figure 5C:
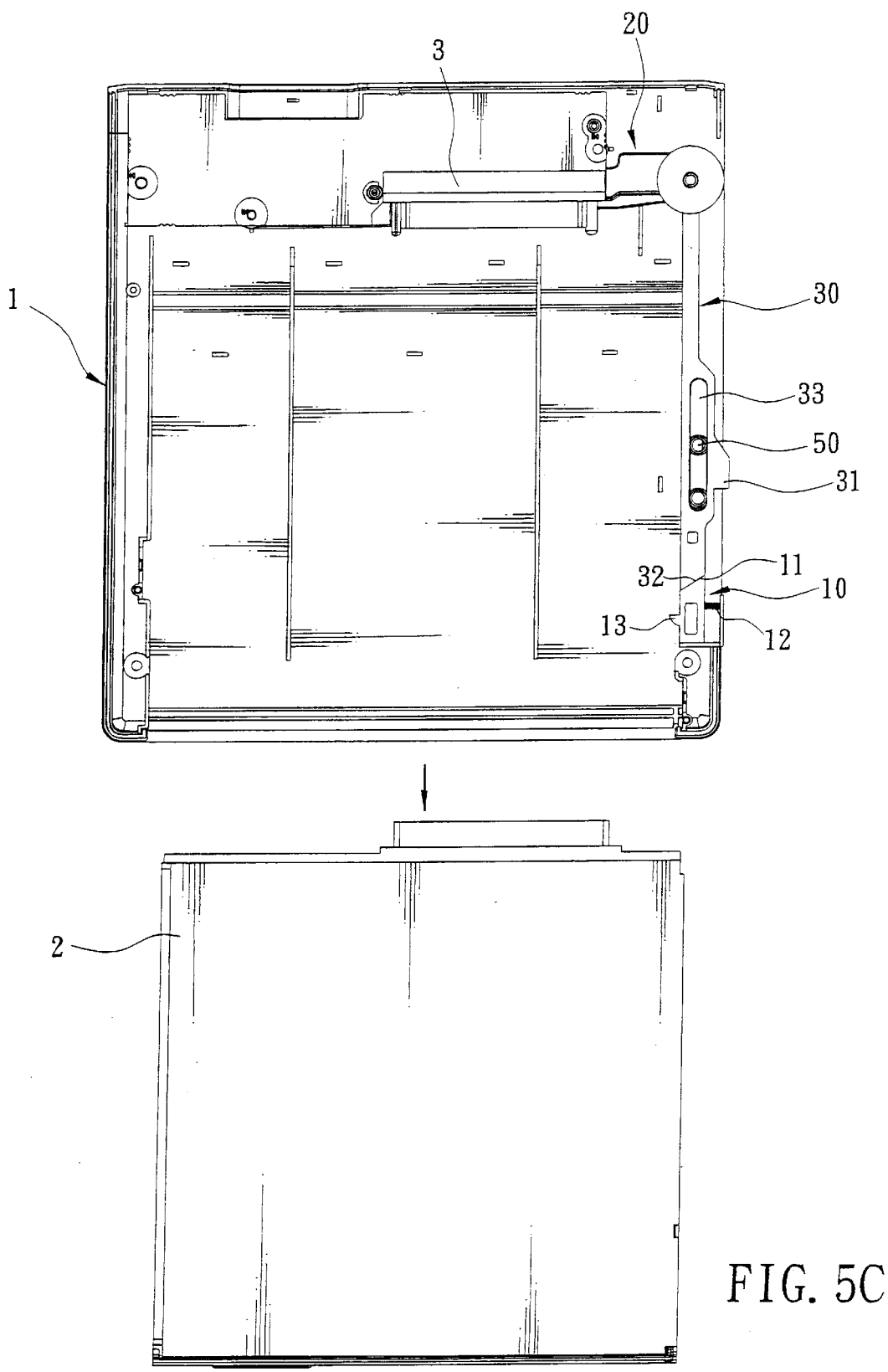

As shown in FIG. 4, to take into account the location of the connection port 3 in the housing chamber 1, the ejection mechanism of the invention must be located on one side of the housing chamber 2 opposite the connection port 3 (below the connection port 3, as shown in the drawing).

Figure 7A:
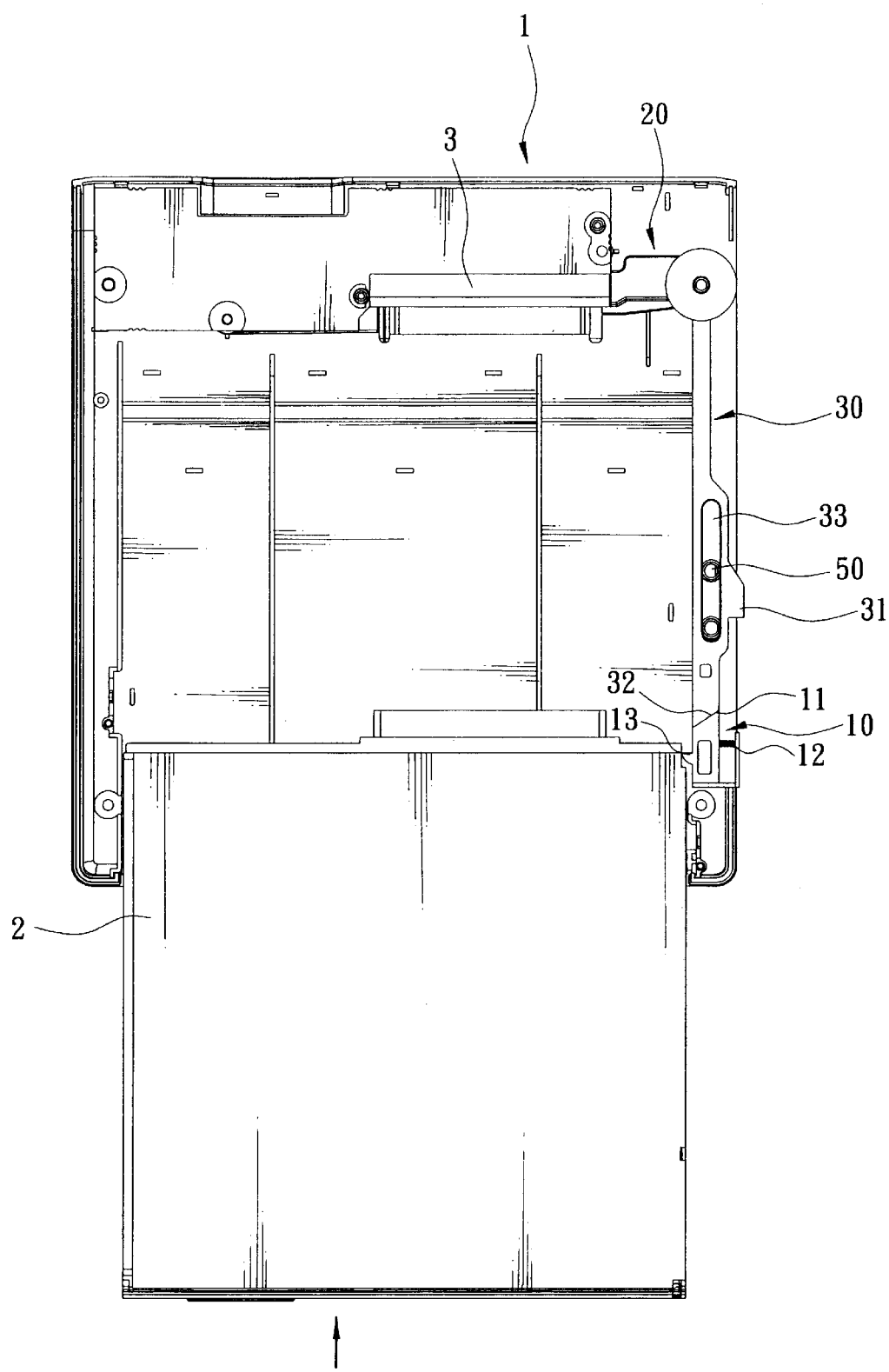
FIGS. 7A, 7B and 7C are schematic views of the invention in various operating conditions, showing the modular electronic element being moved into the housing chamber.
Figure 7B:
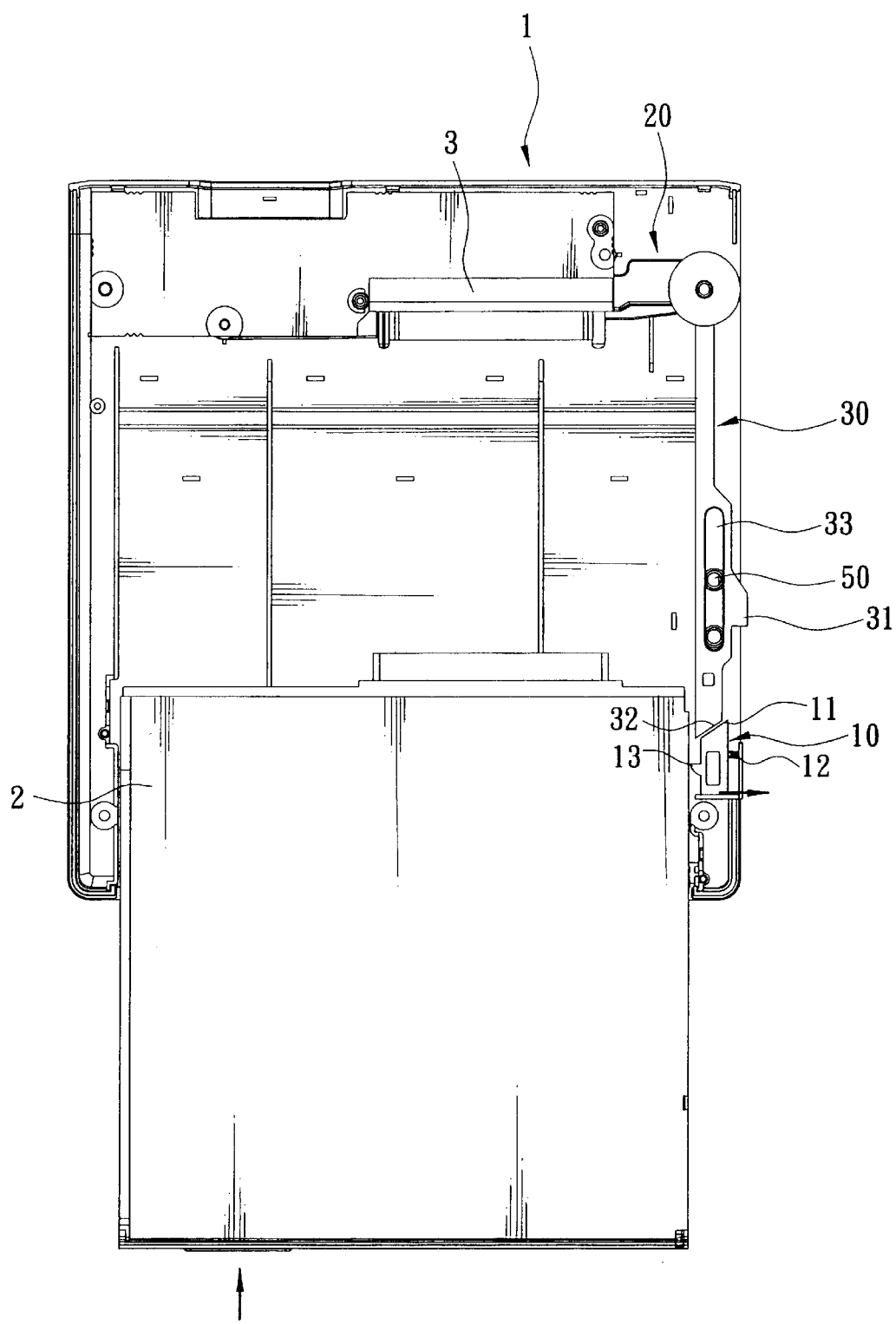
Figure 7C:
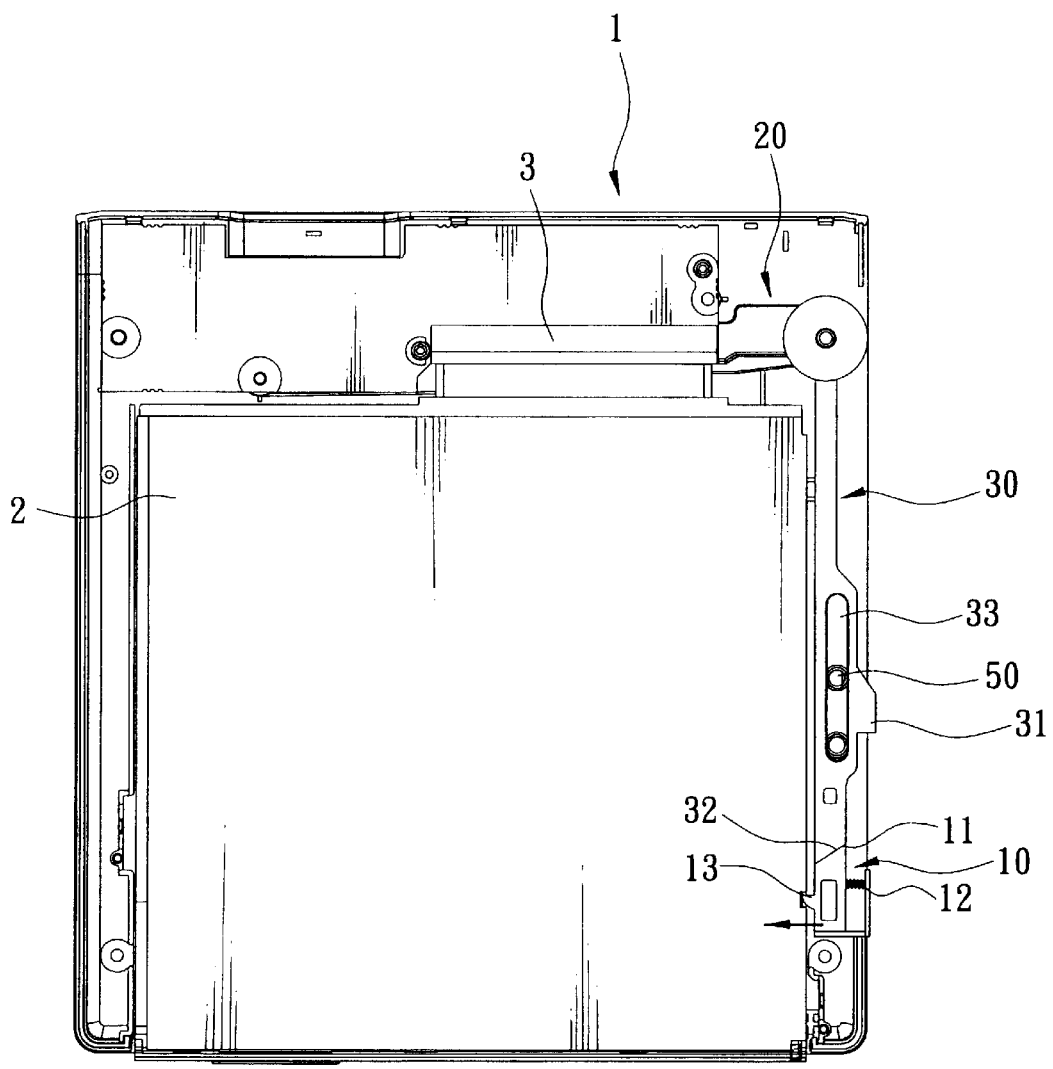

Referring to FIGS. 5A, 5B, 5C and 6, an optical disk drive is used as an example. When the invention is in operation, move the ejection member 31 towards the opening of the housing chamber 1. Under the constraints of the slot 33 and the guiding strut 50, the second rod member 30 is driven to move the first rod member 20, and the ejector 21 pushes the modular electronic element 2 to slip out of the housing chamber 1. Meanwhile the second wedge surface 32 contacts and pushes the first wedge surface 11 to move the latch member 10 sideways to compress the elastic element 12, and the latch lug 13 of the latch member 10 is moved away from the modular electronic element 2 to release the latch on the modular electronic element 2. After the ejection member 31 is released, the elastic force of the elastic element 12 pushes the latch member 10 and moves the latch lug 13 to engage with the modular electronic element 2. Similarly, the first wedge surface 11 pushes the second wedge surface 32, and under the constraints to the slot 33 and the guiding strut 50, the latch member 10 drives the second rod member 30 which in turn drives the first rod member 20 such that the latch lug 13 of the latch member 10 may engage with the modular electronic element 2 at the desired location. The retainer 40 restricts the range of motion of the first rod member 20, and the second rod member 30 is moved back to its original position. Refer to FIGS. 7A, 7B and 7C for movements of the latch member 13. When the modular electronic element 2 is inserted into the housing chamber 1, the latch member 10 is compressed by the modular electronic element 2, and the elastic element 12 also is compressed. Once the modular electronic element 2 is completely housed in the housing chamber 1, the latch lug 13 of the latch member 10 latches onto the modular electronic element 2.

Figure 8:
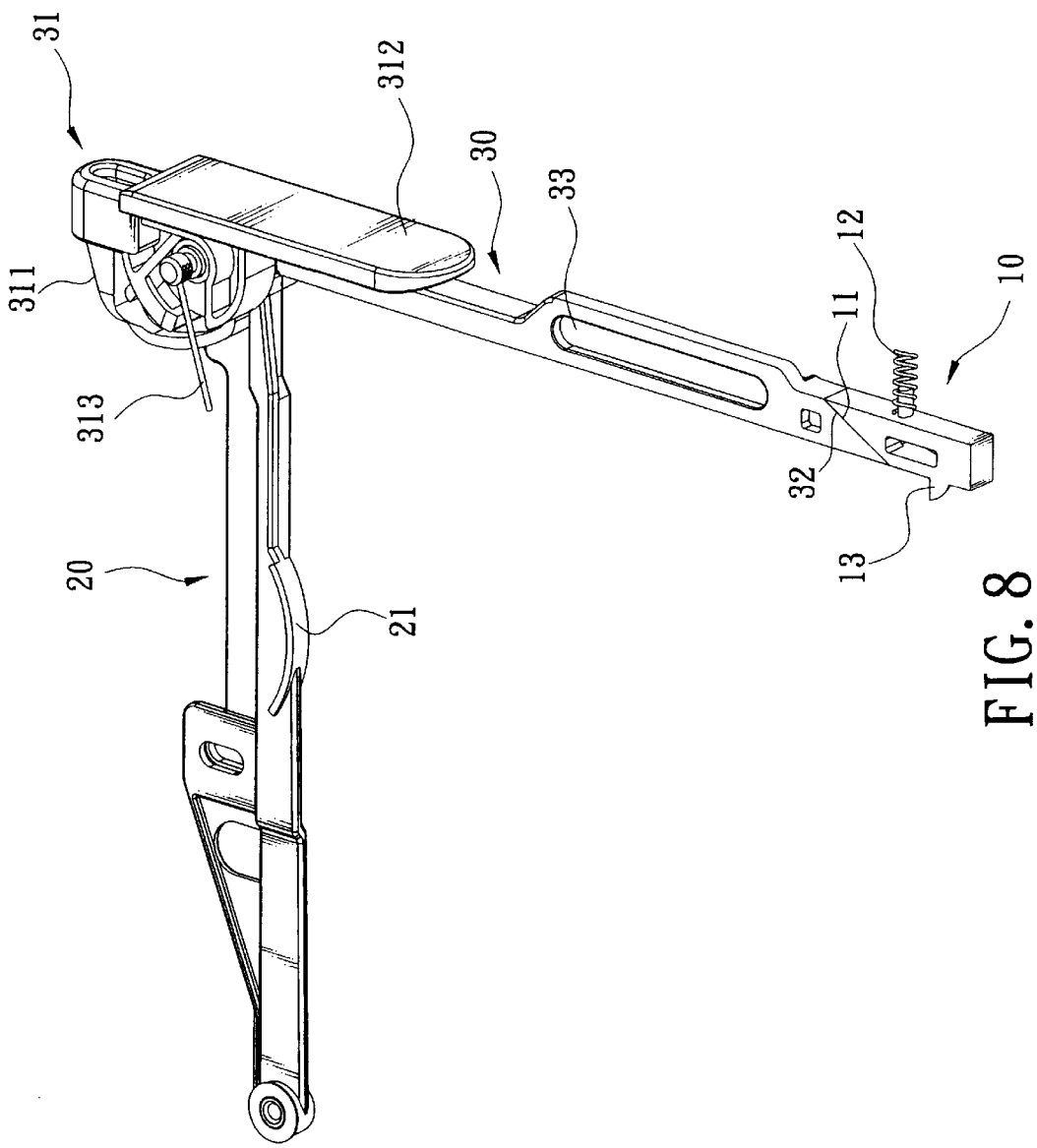
FIG. 8 is a perspective view of a second embodiment of invention.
Figure 9A:
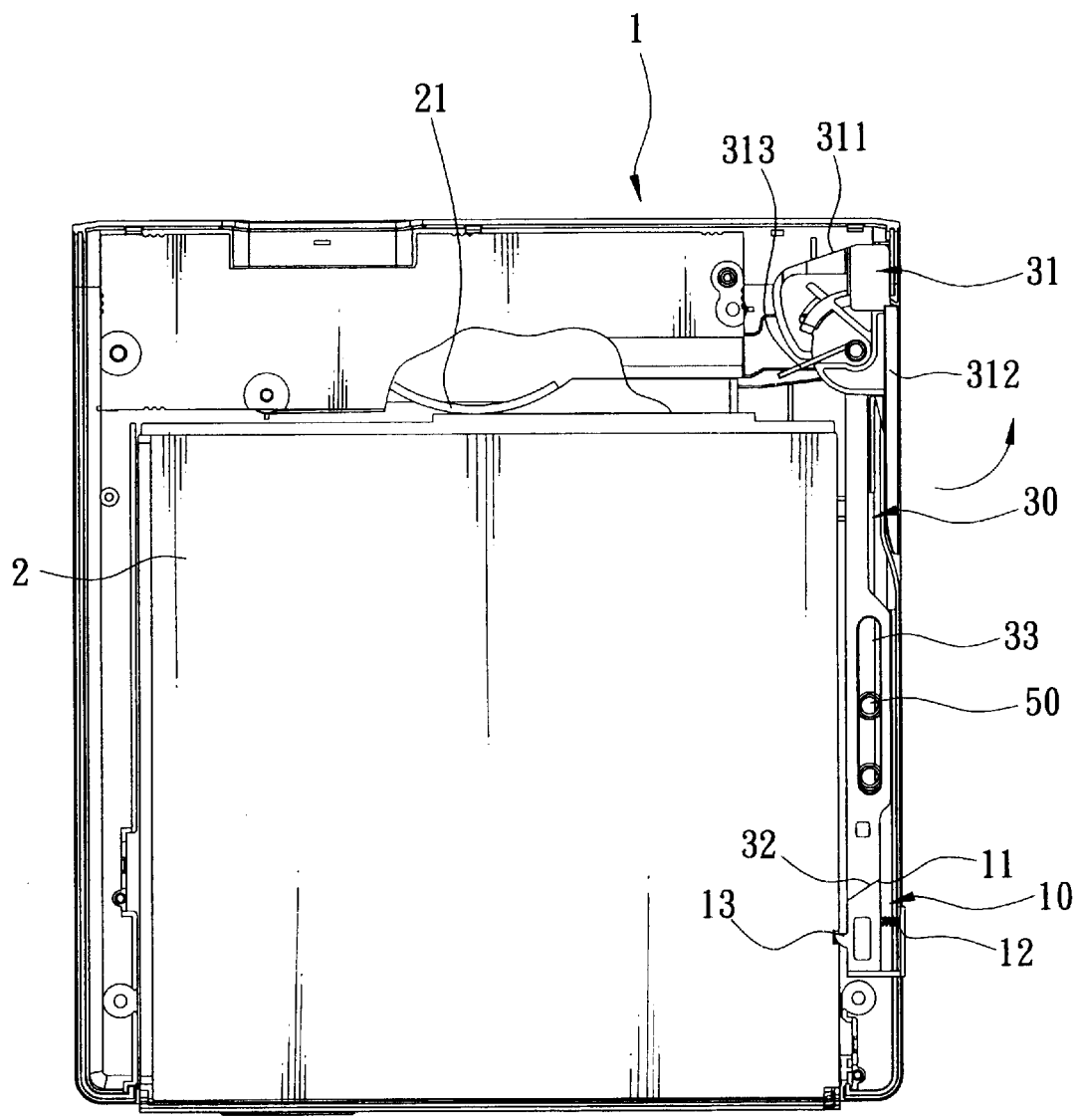
FIGS. 9A, 9B, 9C and 9D are schematic views of the second embodiment in various operating conditions, showing a modular electronic element being ejected from the housing chamber.
Figure 9B:
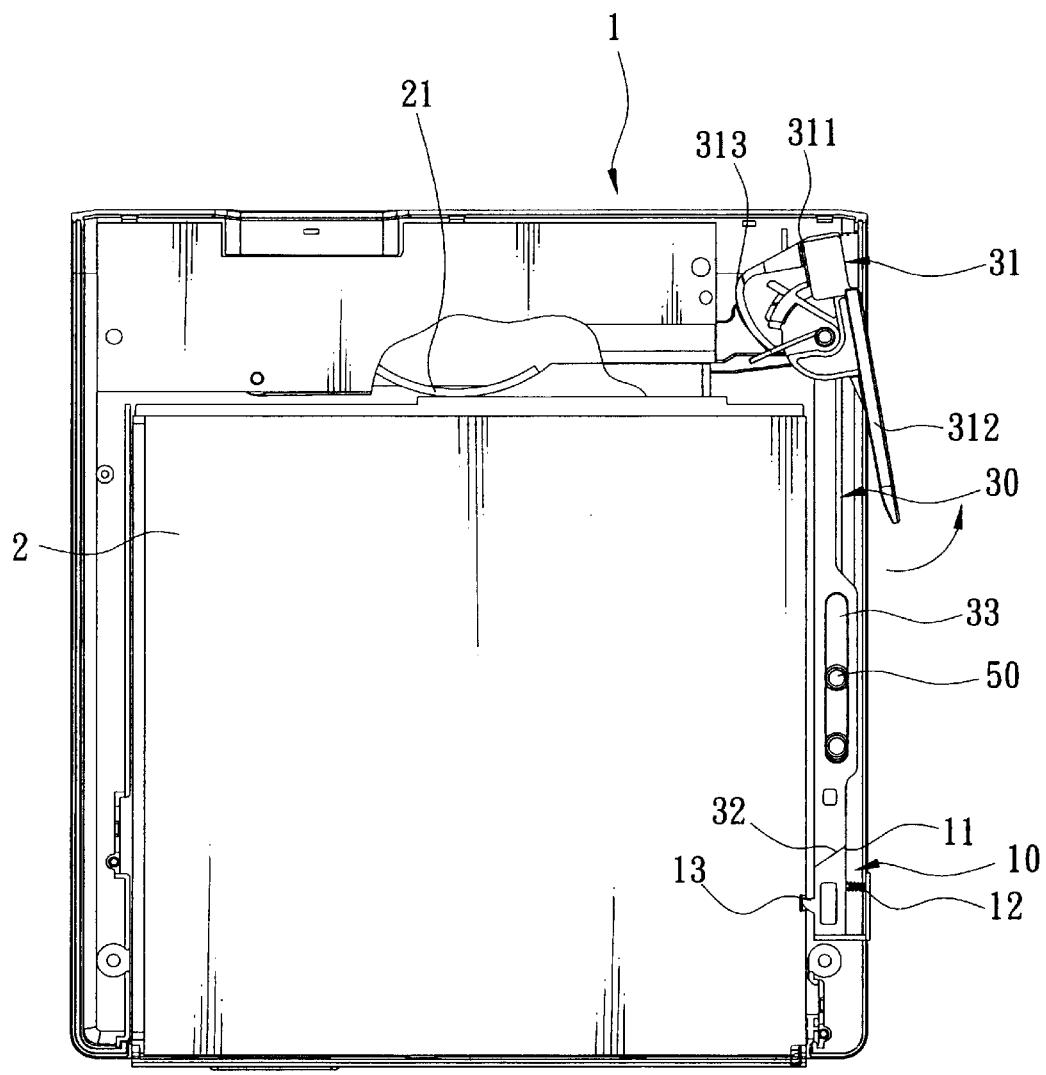

Refer to FIGS. 8 and 9A for a second embodiment of the invention. The ejection mechanism is adopted for use in a housing chamber 1 of an electronic device. The housing chamber 1 may be built in the electronic device or externally connected to the electronic device for housing a modular electronic element 2 (such as a disk drive of various types). The ejection mechanism consists of a latch member 10, a first rod member 20, a second rod member 30 and an ejection member 31, and enables the modular electronic element to be easily removed from the housing chamber of the electronic device for replacement.

The latch member 10 is movably located on a lateral side of the housing chamber 1, and has a first wedge surface 11, an elastic element 12, and a latch lug 13. The first wedge surface 11 has a pointed edge adjacent to the lateral side of the housing chamber 1. The elastic element 12 is located between the latch member 10 and the lateral side of the housing chamber 1, and may be a spring. The latch lug 13 engages with the modular electronic element 2 when the latch member 10 is in normal condition.

Figure 2:
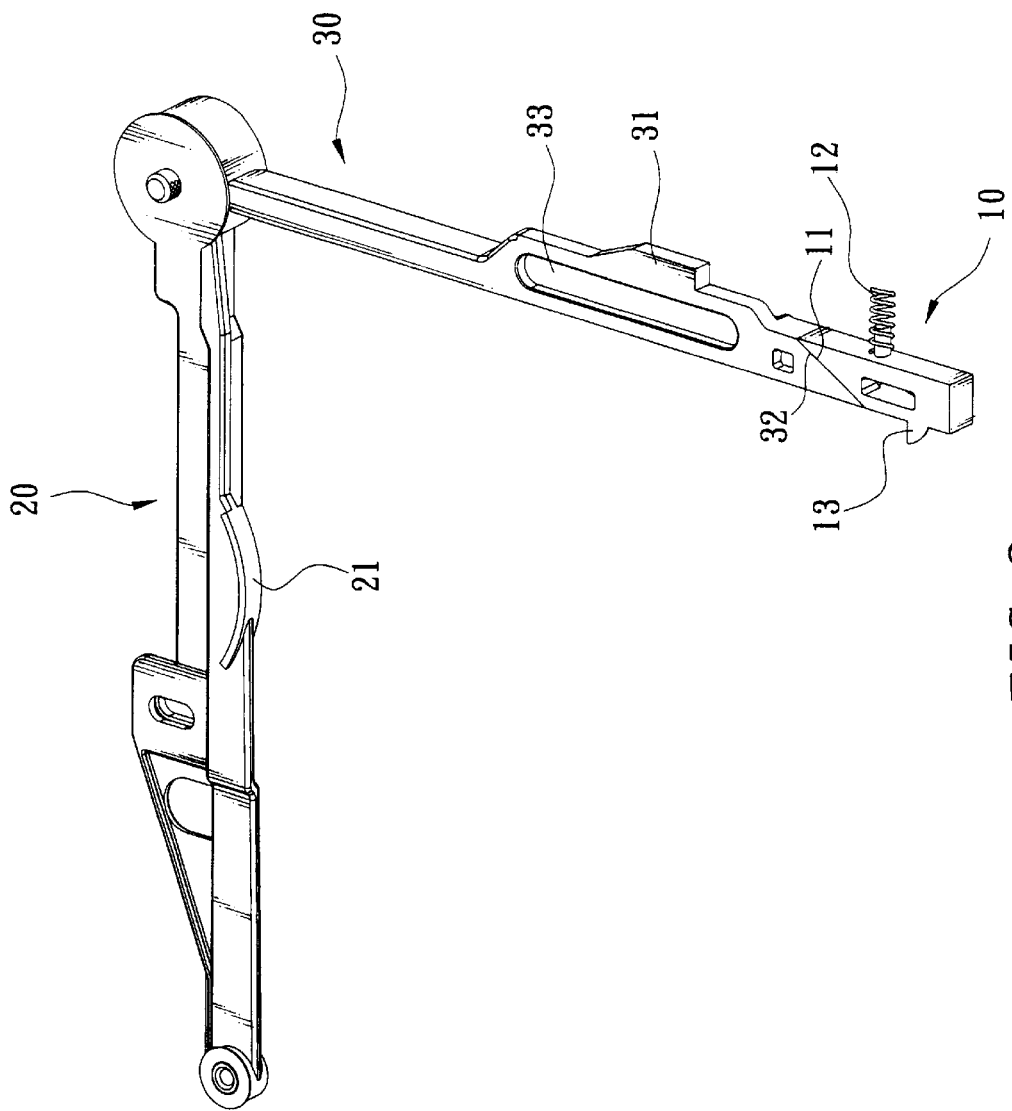
FIG. 2 is a perspective view of the first embodiment of invention.
Figure 3:
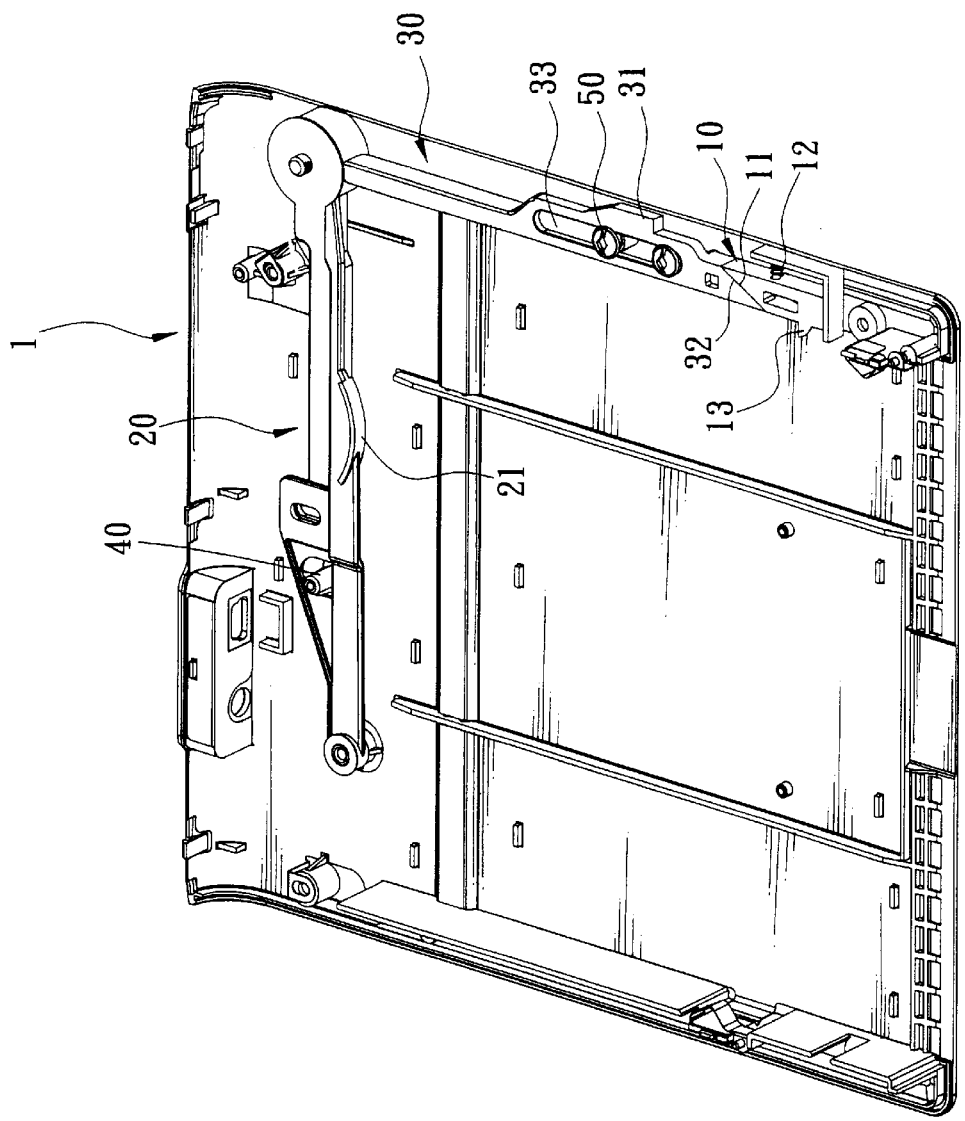
FIG. 3 is a perspective view of the first embodiment of invention, adopted in a housing chamber.
Figure 9C:
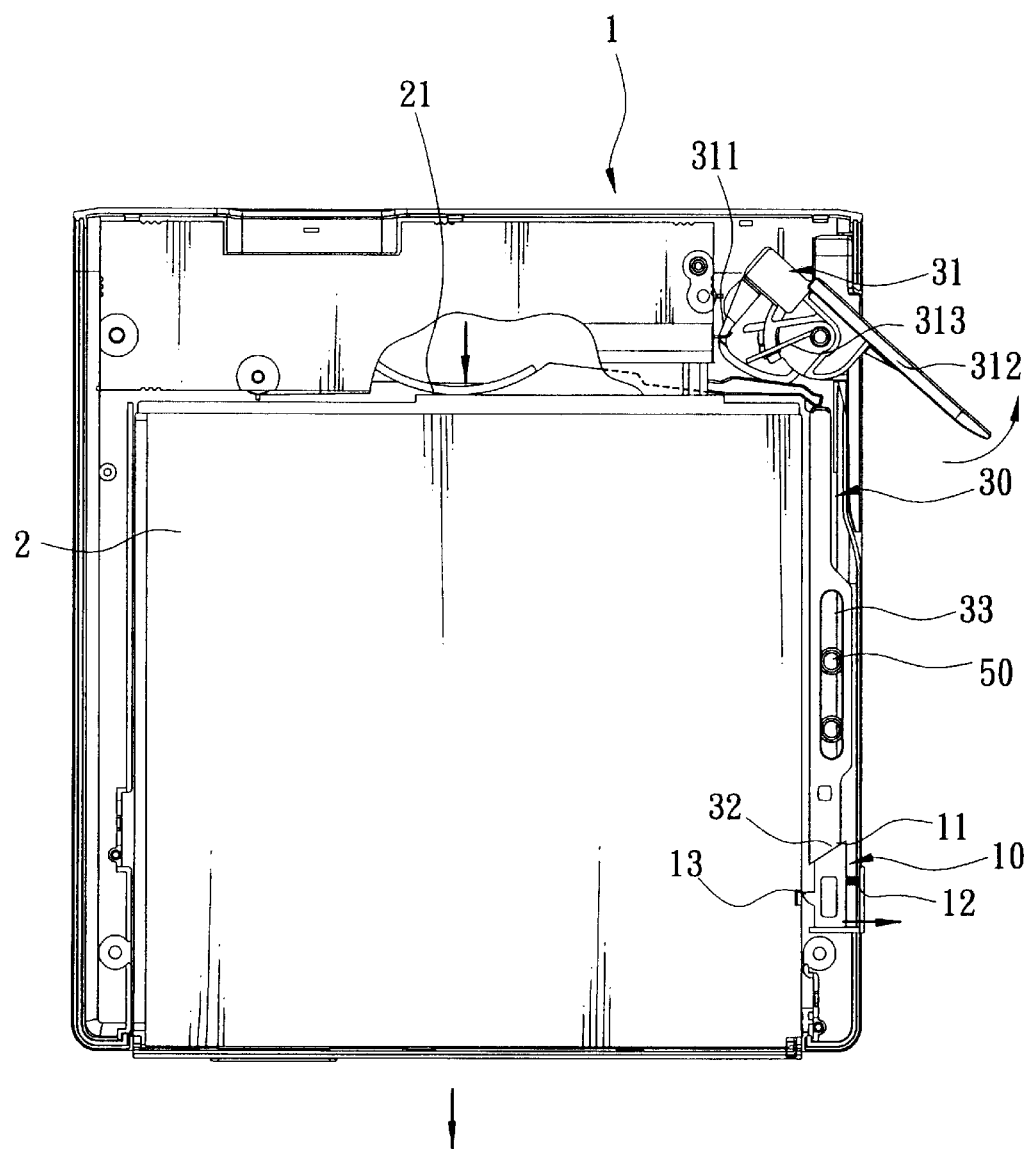
Figure 9D:
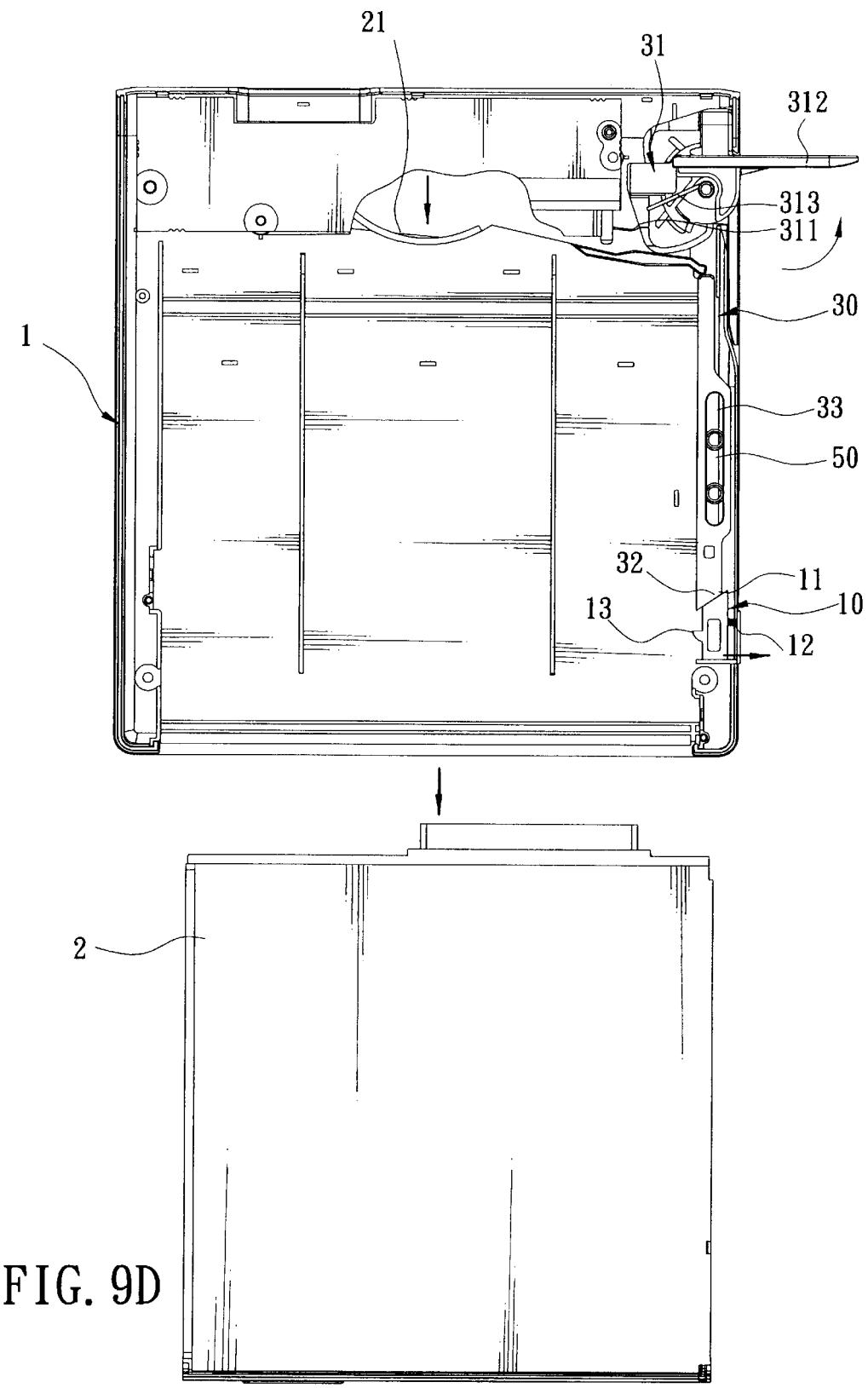

The first rod member 20 is movably and pivotally located in the housing chamber 1, corresponds to the modular electronic element 2, and has one end corresponding to the other end of the second rod member 30 (the first rod member 20 and the second rod member 30 may be pivotally engaged as shown in FIG. 2, or the first rod member 20 may be bonded to the other end of the second rod member 30 as shown in FIG. 9C). The first rod member 20 further has an ejector 21 located on one side thereof. The ejector 21 is an arch-shaped element extending from the first rod member 20 that corresponds to the modular electronic element 2 (the two may contact with each other, or contact with each other during operation).

The second rod member 30 is movably located in the housing chamber 1 corresponding to the latch member 10, forms a linkage relationship with the first rod member 20, and includes a second wedge surface 32 and a slot 33. The second wedge surface 32 corresponds to the first wedge surface 11 (the two may contact with each other, or contact with each other during operation). The slot 33 is an elongated groove for housing a guiding strut 50 to channel and restrict the second rod member 30 to move in a straight direction.

The ejection member 31 forms a linkage relationship with the first rod member 20 and the second rod member 30 for driving the second rod member 30 to move the latch member 10 and release the latch member 10 from the modular electronic element 2. The modular electronic element 2 may be ejected from the housing chamber 1 by means of the first rod member 20. The ejection member 31 is pivotally located in the housing chamber 1, and includes a cam 311, a lever 312 extending outside the lateral side of the housing chamber 1 and a torsional element 313. When the latch member 10 engages with the modular electronic element 2, the cam surface of the cam 311 spaced from the cam axis at a longer distance is separate from the first rod member 20, while the cam surface spaced from the cam axis at a shorter distance contacts the first rod member 20. The lever 312 may be moved to eject the modular electronic element 2. The torsional element 31 3 may be a torsional spring and is coupled on the axis of the ejection member 31 to move the ejection member 31 back to the position corresponding to where the latch member 10 is located when the latch lug 13 latches on the modular electronic element 2.

Referring to FIGS. 9A, 9B, 9C, 9D and 10, when the invention is in operation, move the lever 312 of the ejection member 31; the ejection member 31 is turned against the torsional force of the torsional element 313, and the cam surface of the cam 311 spaced from the cam axis at a longer distance presses the first rod member 20 and drives the first rod member 20 towards the opening of the housing chamber 1. The ejector 21 pushes the modular electronic element 2 to slip out of the housing chamber 1. Under the constraints of the slot 33 and the guiding strut 50, the second rod member 30 is driven. Meanwhile, the second wedge surface 32 pushes the first wedge surface 11 to move the latch member 10 sideways and compress the elastic element 12, and the latch lug 13 of the latch member 10 is moved away from the modular electronic element 2 to release the latch on the modular electronic element 2. After the ejection member 31 is released, the torsional element 31, by means of its torsional force, returns to the position corresponding to where the latch member 10 is located when the latch lug 13 latches on the modular electronic element 2. The elastic force of the elastic element 12 also moves the latch member 10 to where the latch lug 13 latches on the modular electronic element 2. Similarly, the first wedge surface 11 pushes the second wedge surface 32, and under the constraints of the slot 33 and the guiding strut 50, the latch member 10 drives the second rod member 30 which in turn drives the first rod member 20 to move together to locations corresponding to where the latch member 10 is located when the latch lug 13 latches on the modular electronic element 2. The ejection member 31 also restricts the range of motion of the first rod member 20, and the second rod member 30 is moved back to its original position. Refer to FIGS. 7A, 7B and 7C for movements of the latch member 13. When the modular electronic element 2 is inserted into the housing chamber 1, the latch member 10 is compressed by the modular electronic element 2, and the elastic element 12 also is compressed. Once the modular electronic element 2 is completely housed in the housing chamber 1, the latch lug 13 of the latch member 10 latches onto the modular electronic element 2.

Figure 11:
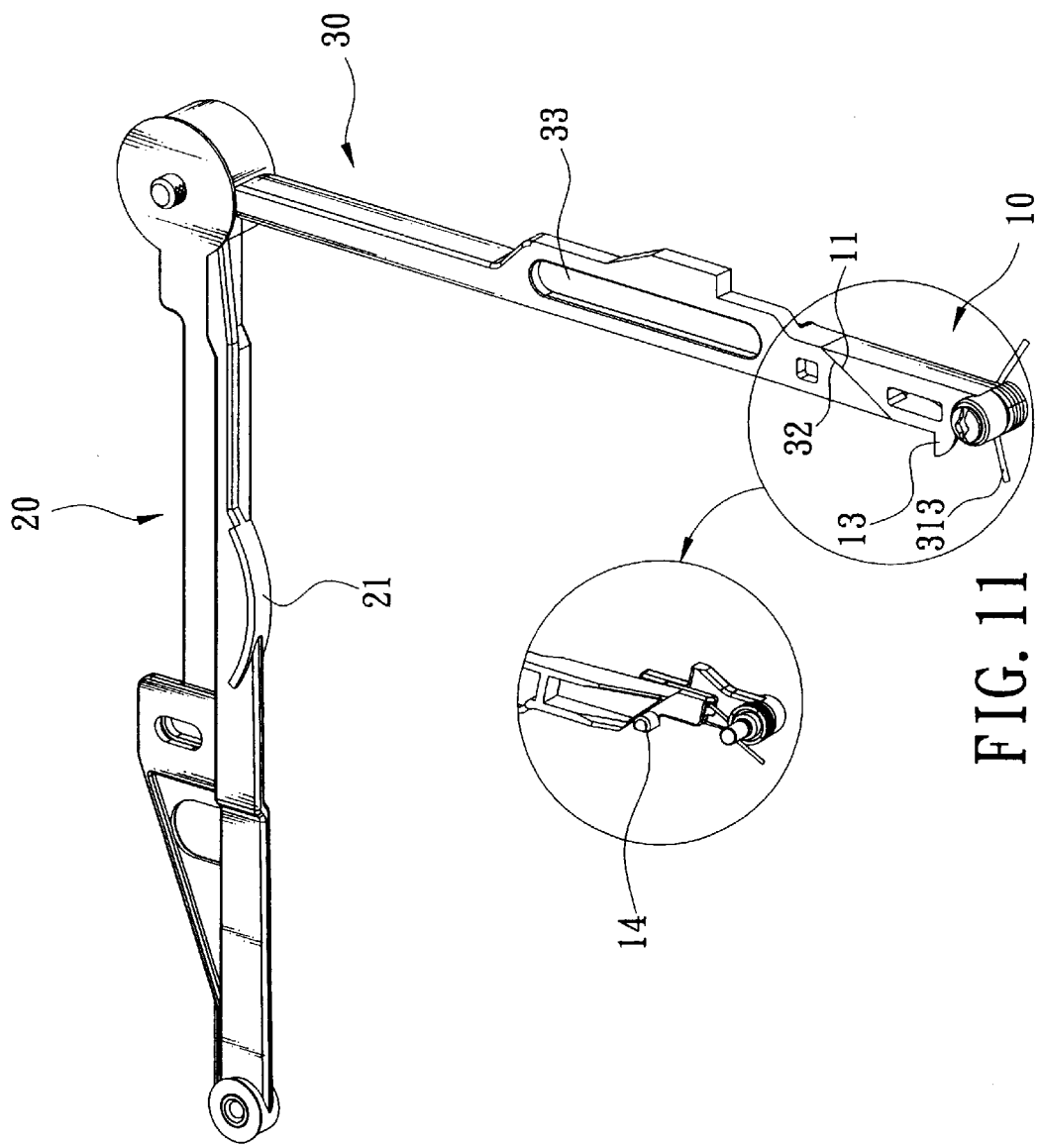
FIG. 11 is a perspective view of the third embodiment of invention.
Figure 12A:
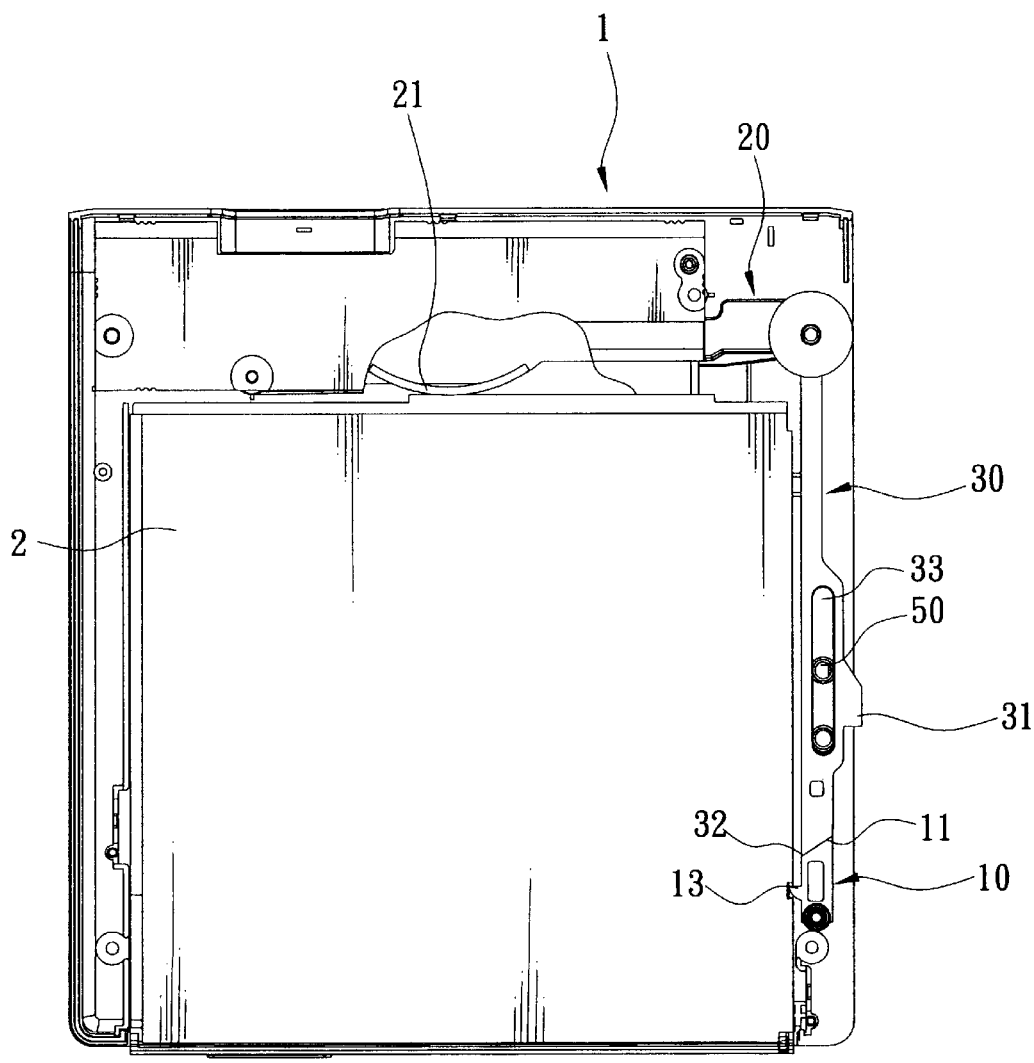
FIGS. 12A, 12B and 12C are schematic views of the third embodiment in various operating conditions, showing a modular electronic element being ejected from the housing chamber.
Figure 12B:
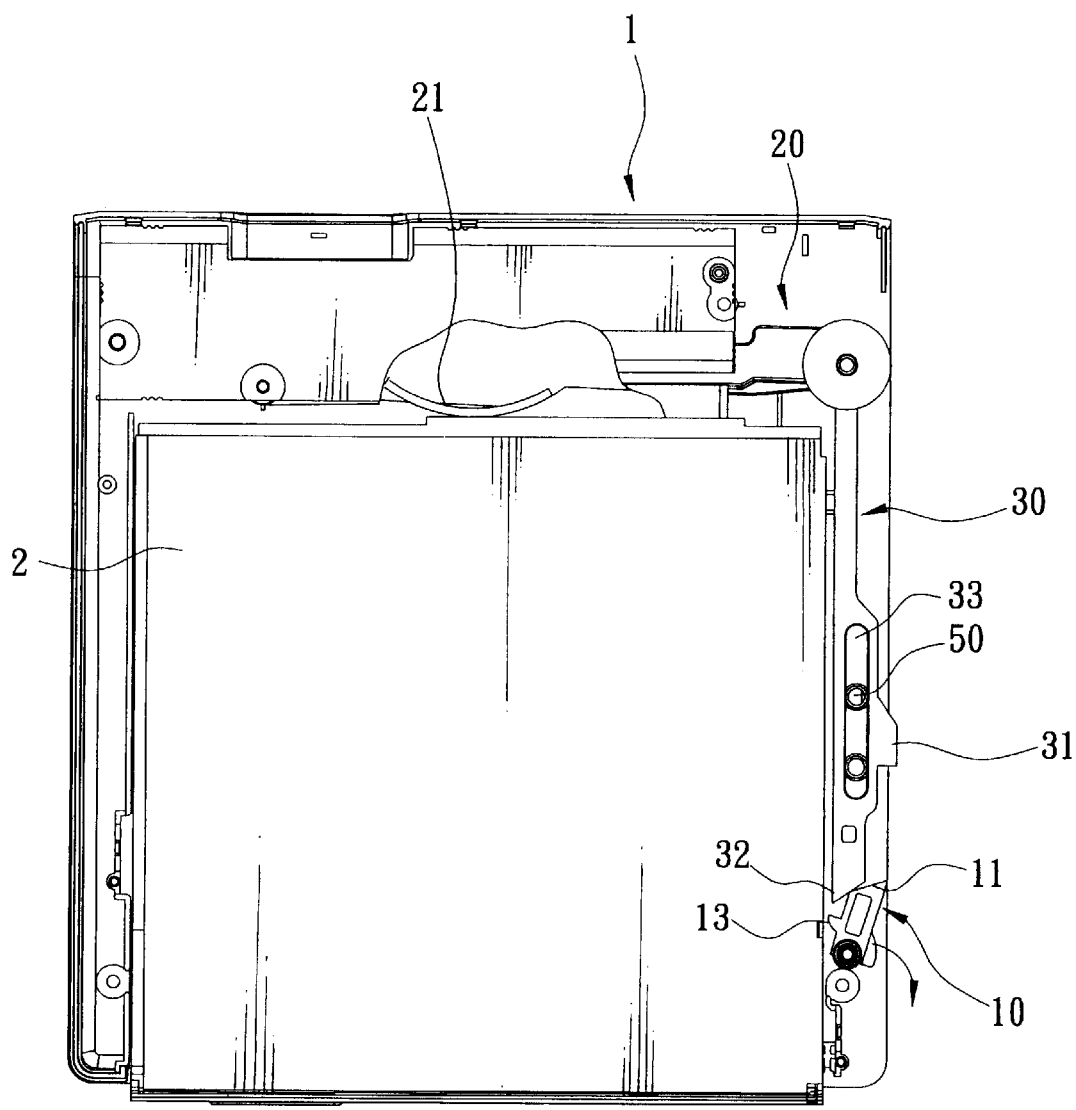
Figure 12C:
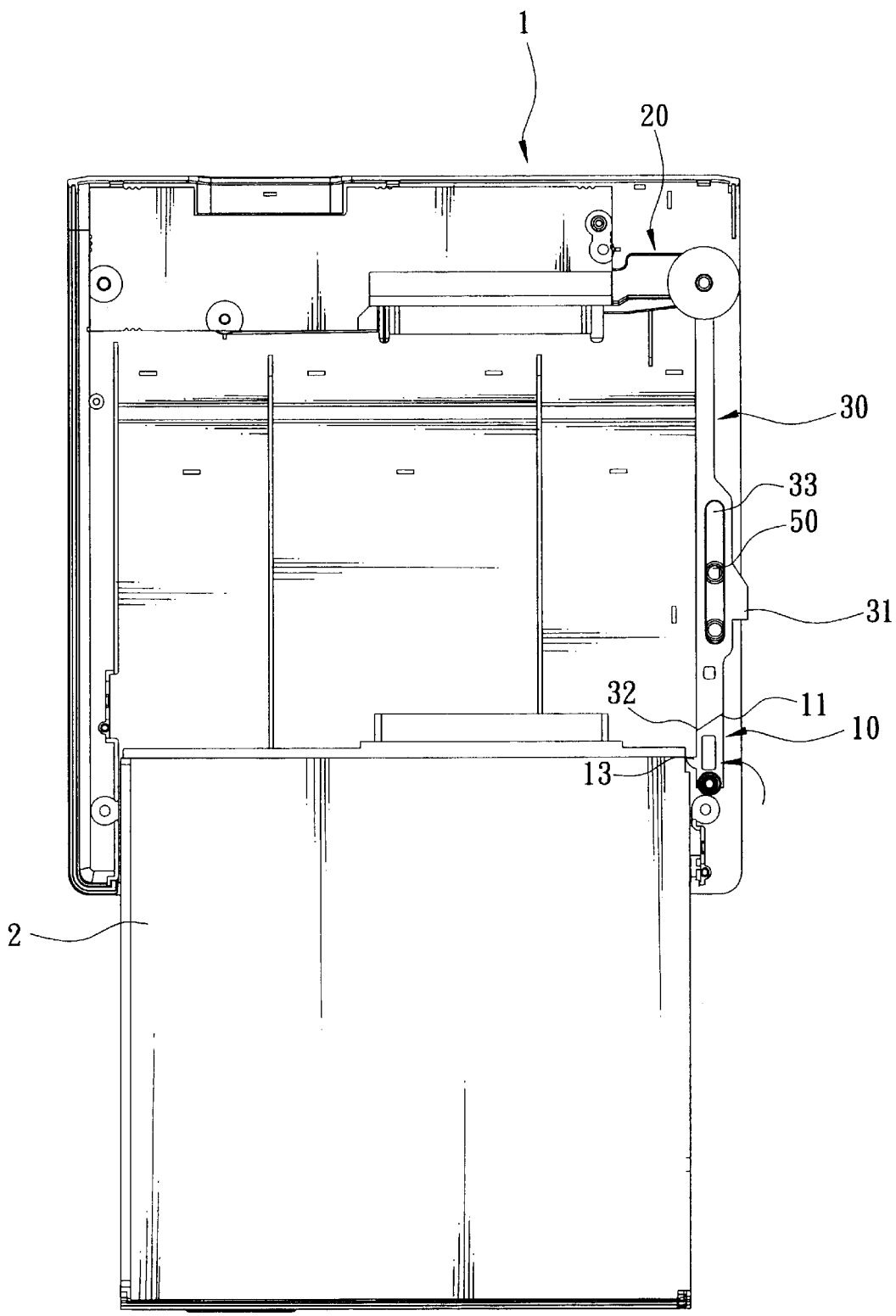

Refer to FIGS. 11 and 12A for a third embodiment of the ejection mechanism for a modular electronic element of the invention. The ejection mechanism is adopted for use in a housing chamber 1 of an electronic device. The housing chamber 1 may be built in the electronic device or externally connected to the electronic device for housing an electronic element 2 (such as a disk drive of various types). The ejection mechanism consists of a latch member 10, a first rod member 20, a second rod member 30 and a retainer 40 to enable the modular electronic element to be easily removed from the housing chamber of the electronic device for replacement.

The latch member 10 is pivotally located on a lateral side of the housing chamber 1, and includes a torsional element 313, a latch lug 13 and a driven element 14. The torsional element 313 may be a torsional spring and is coupled on the pivotal axis of the latch member 10 such that the latch lug 13 is engaged with the modular electronic element 2 in normal conditions.

The first rod member 20 is movably and pivotally located in the housing chamber 1, corresponds to the modular electronic element 2, and has one end pivotally engaging with the second rod member 30. The first rod member 20 further has an ejector 21 located on one side thereof. The ejector 21 is an arch-shaped element extending from the first rod member 20 that corresponds to the modular electronic element 2 (the two may contact with each other, or contact with each other during operation).

The second rod member 30 is movably located in the housing chamber 1 corresponding to the latch member 10, forms a linkage relationship with the first rod member 20, and includes an ejection member 31, a first wedge surface 11, a slot 33 and an elastic element 12. The ejection member 31 extends outside the lateral side of the housing chamber 1 and forms a linkage relationship with the first rod member 20 and the second rod member 30 for driving the second rod member 30 to move the latch member 10 to release the latch member 10 from the modular electronic element 2. The modular electronic element 2 may be ejected from the housing chamber 1 by the first rod member 20. The first wedge surface 11 corresponds to the driven element 14 (the two may contact with each other, or contact with each other during operation) for moving the first rod member 20 through the driven element 14. The slot 33 is an elongated groove for housing a guiding strut 50 to channel and restrict the second rod member 30 to move in a straight direction. The elastic element 12 may be a spring and is adjacent to the latch member 10. The elastic element 12 and the latch member 10 are located on two different and parallel surfaces to enable the second rod member 30 to move back to the location corresponding to where the latch member 10 is located when the latch lug 13 latches on the modular electronic element 2.

The retainer 40 is located in the housing chamber 1 on one side of the first rod member 20 opposite the modular electronic element 2 to limit the range of motion of the first rod member 20.

Figure 13A:
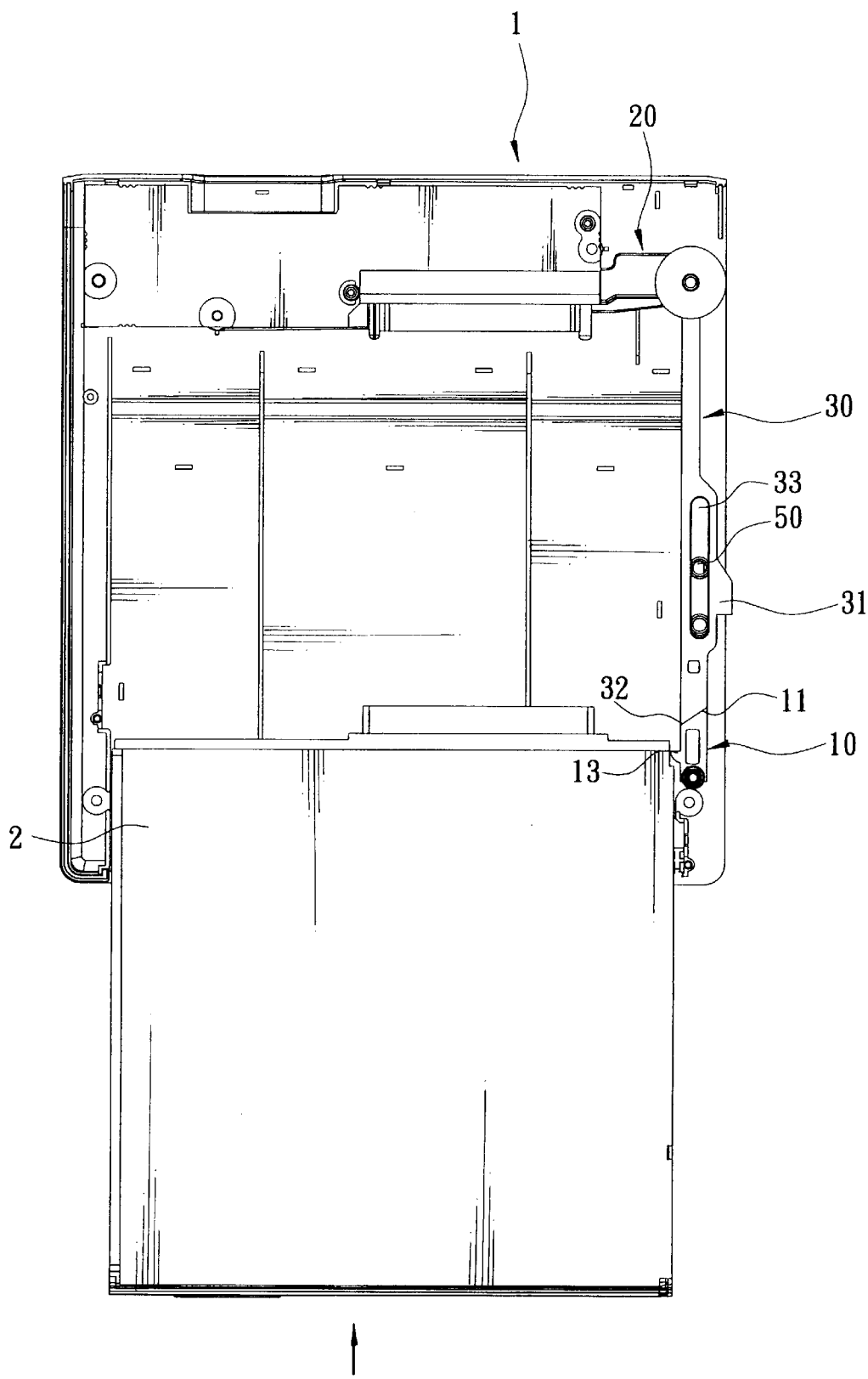
FIGS. 13A, 13B and 13C are schematic views of the invention in various operating conditions, showing the modular electronic element being moved into the housing chamber.
Figure 13B:
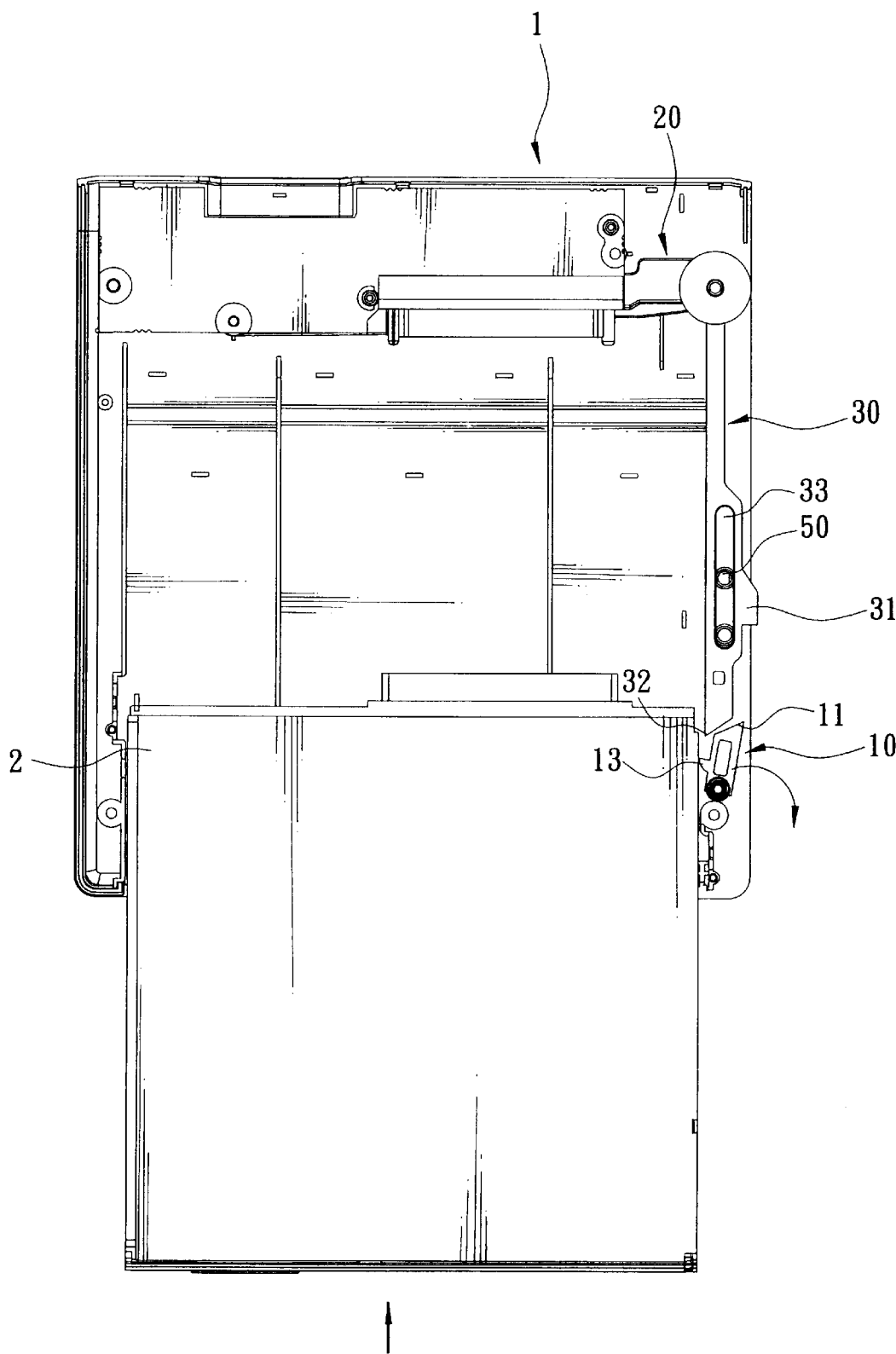
Figure 13C:
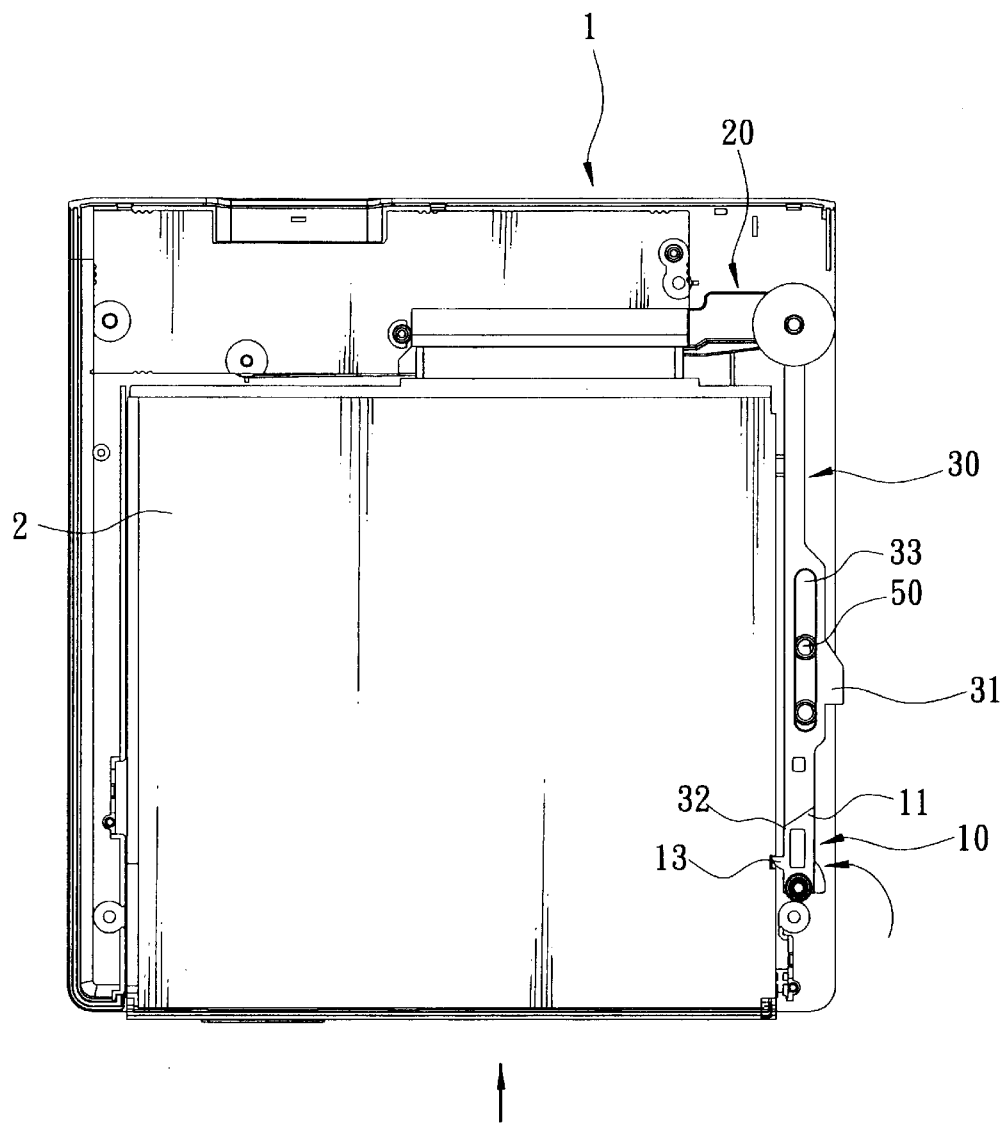

Referring to FIGS. 6, 12A, 12B and 12C, when the invention is in operation, move the ejection member 31 towards the direction of the opening of the housing chamber 1 Under the constraints of the slot 33 and the guiding strut 50, the second rod member 30 is driven and the first rod member 20 is also moved. As a result, the ejector 21 pushes the modular electronic element 2 to slip out of the housing chamber 1. Meanwhile, the first wedge surface 11 pushes the driven element 14 to turn the torsional element 313, and the latch lug 13 of the latch member 10 is moved away from the modular electronic element 2 to release the latch from the modular electronic element 2. After the ejection member 31 is released, torsional force of the torsional spring 313 turns the latch member 10 to a location where the latch lug 13 latches on the modular electronic element 2. Similarly the first wedge surface 11 pushes the driven element 14, and under the constraints of the slot 33 and the guiding strut 50, the latch member 10 drives the second rod member 30 which in turn drives the first rod member 20 to move together to locations corresponding to where the latch member 10 is located when the latch lug 13 latches on the modular electronic element 2. Meanwhile, the retainer 40 restricts the range of motion of the first rod member 20, and the second rod member 30 is moved back to its original position. Refer to FIGS. 13A, 13B and 13C for movements of the latch member 13. When the modular electronic element 2 is inserted into the housing chamber 1, the latch member 10 is compressed by the modular electronic element 2 against the torsional force of the torsional element 313. Once the modular electronic element 2 is completely housed in the housing chamber 1, the latch lug 13 of the latch member 10 latches onto the modular electronic element 2.

Figure 14:
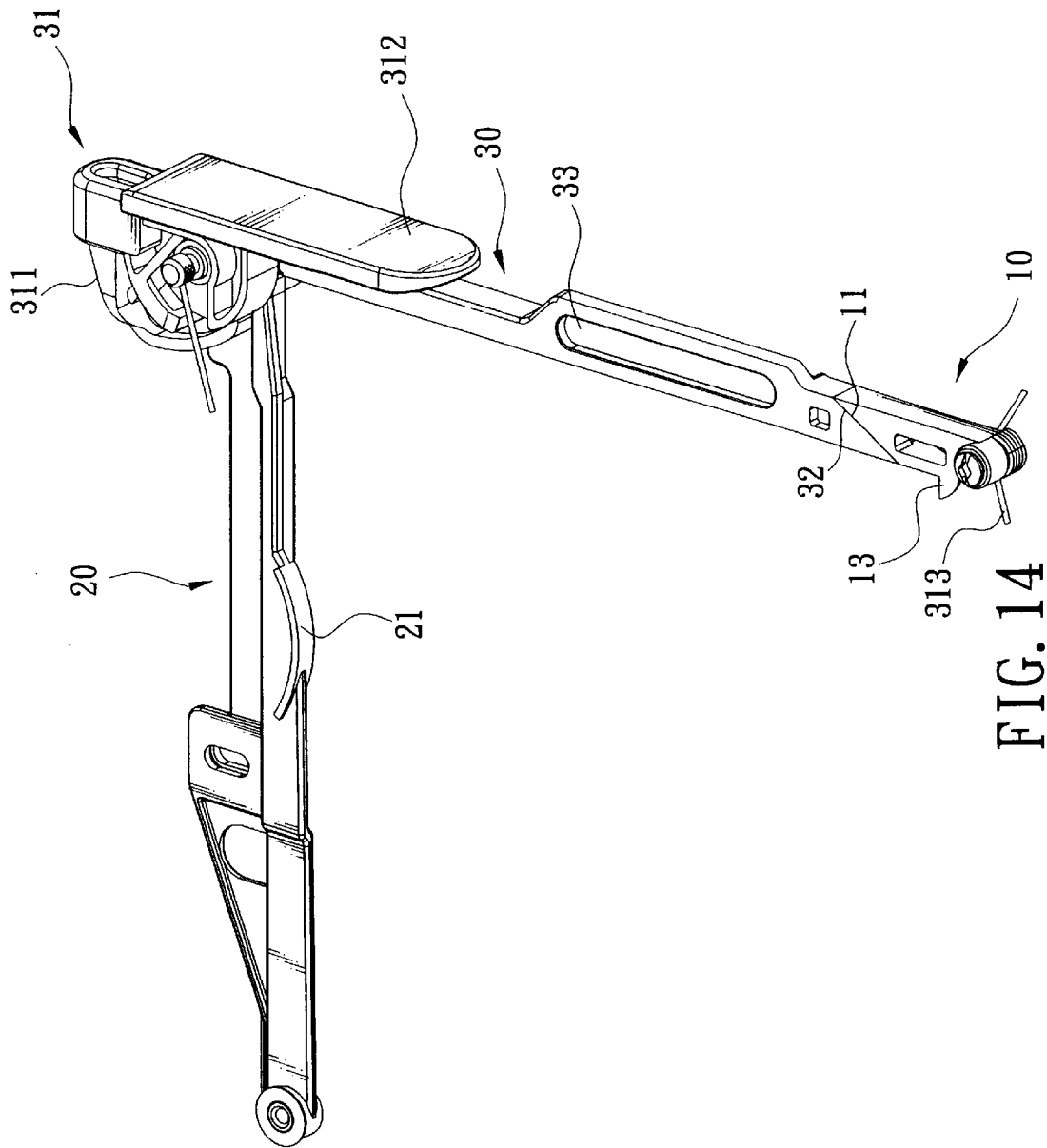
FIG. 14 is a perspective view of the fourth embodiment of invention.
Figure 15A:
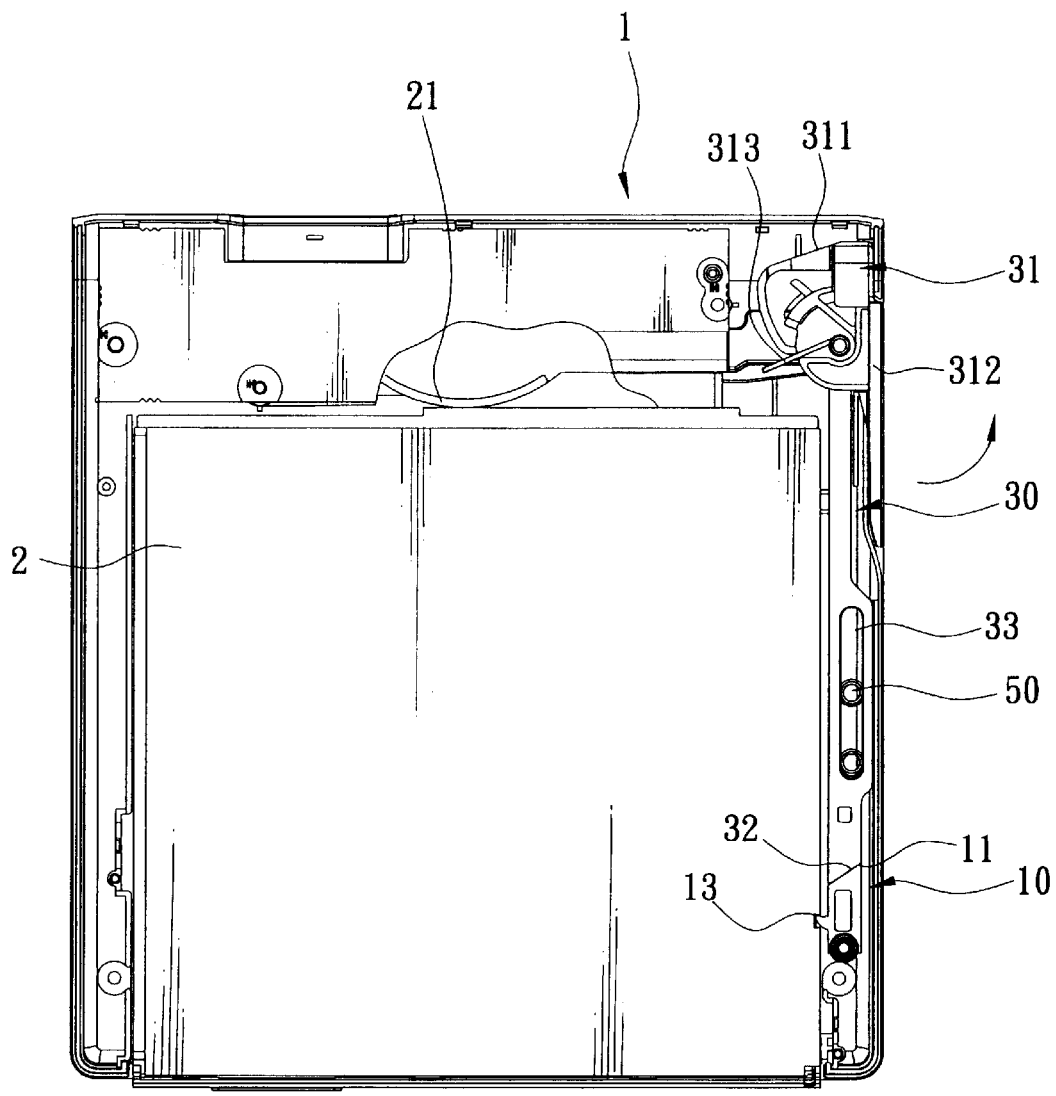
FIGS. 15A, 15B, 15C and 15D are schematic views of the fourth embodiment in various operating conditions, showing d modular electronic element being ejected from the housing chamber.
Figure 15B:
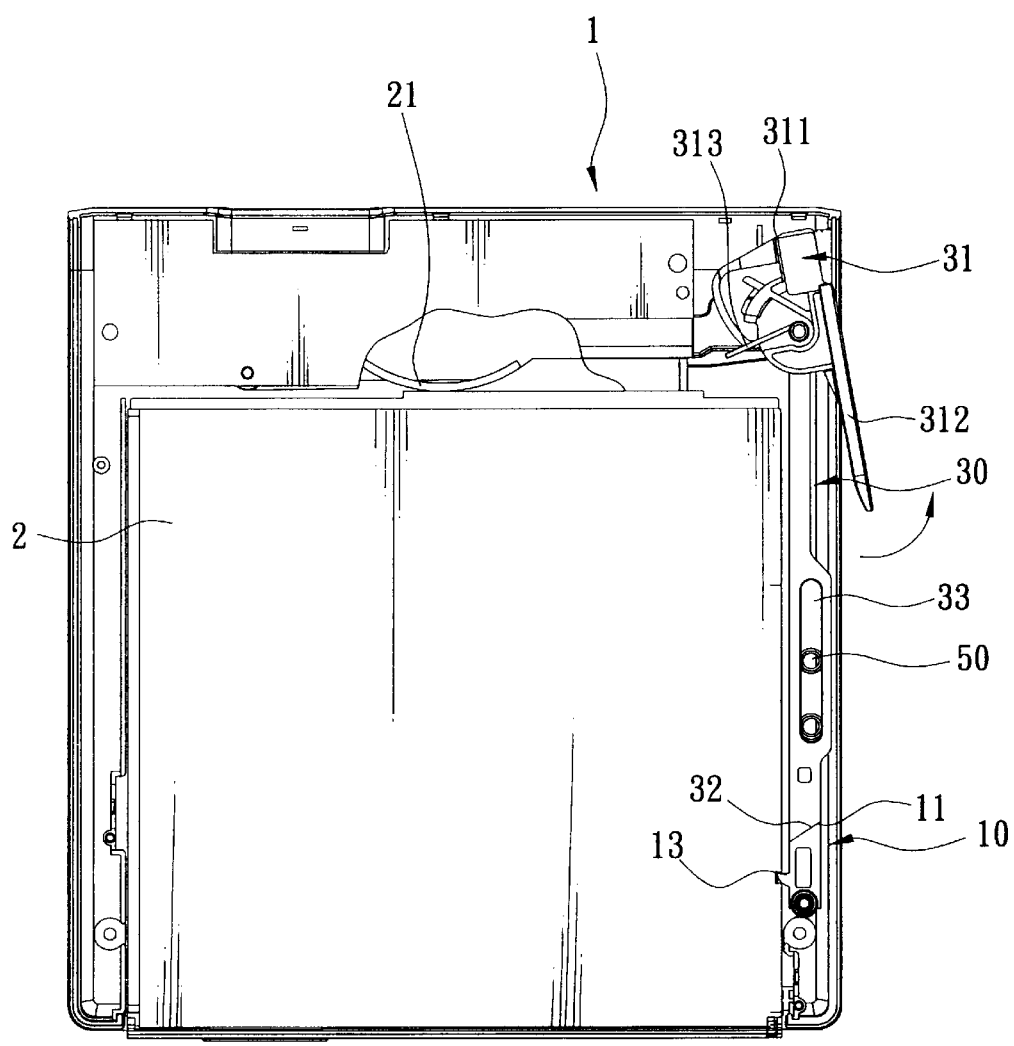
Figure 15C:
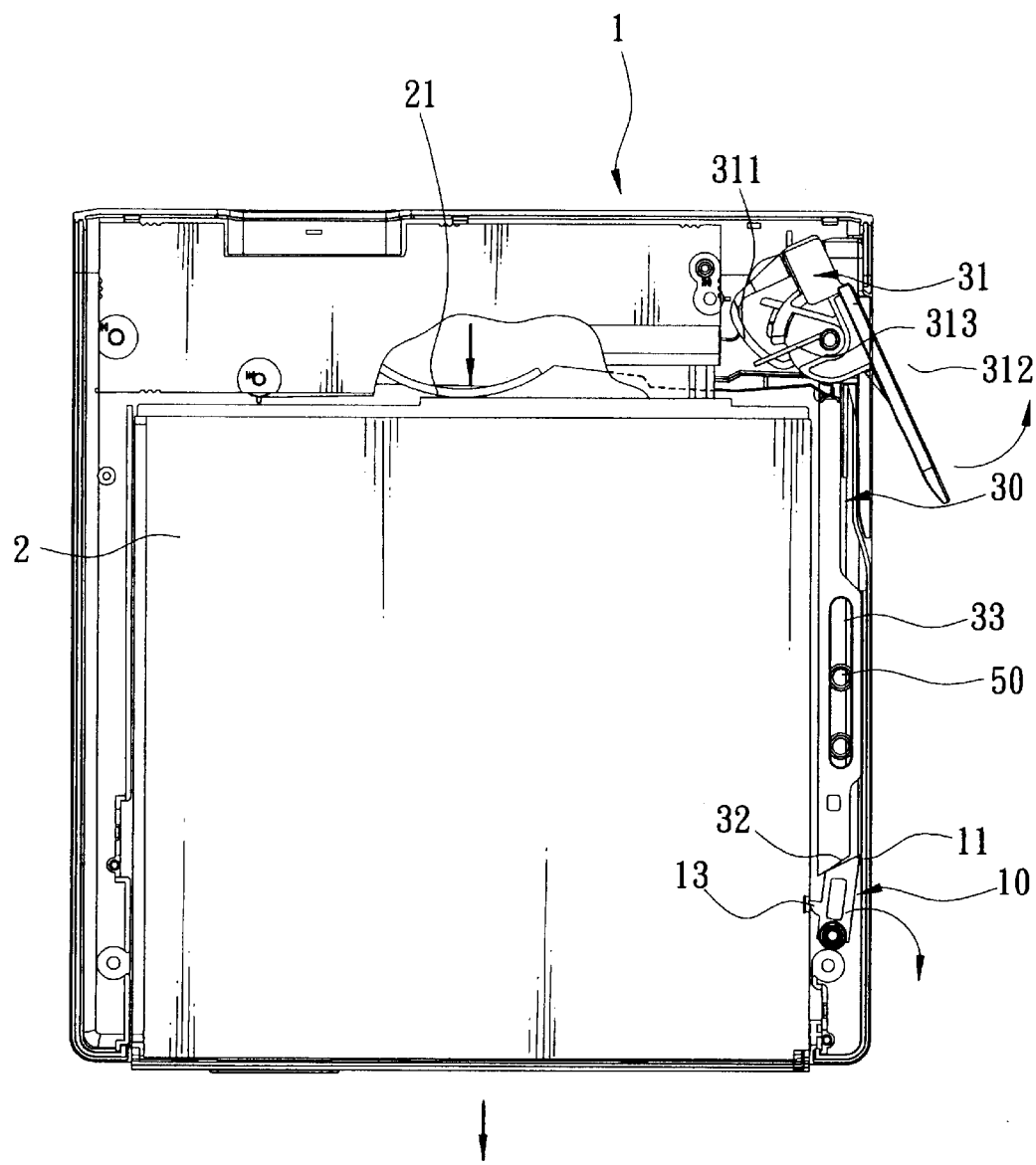
Figure 15D:
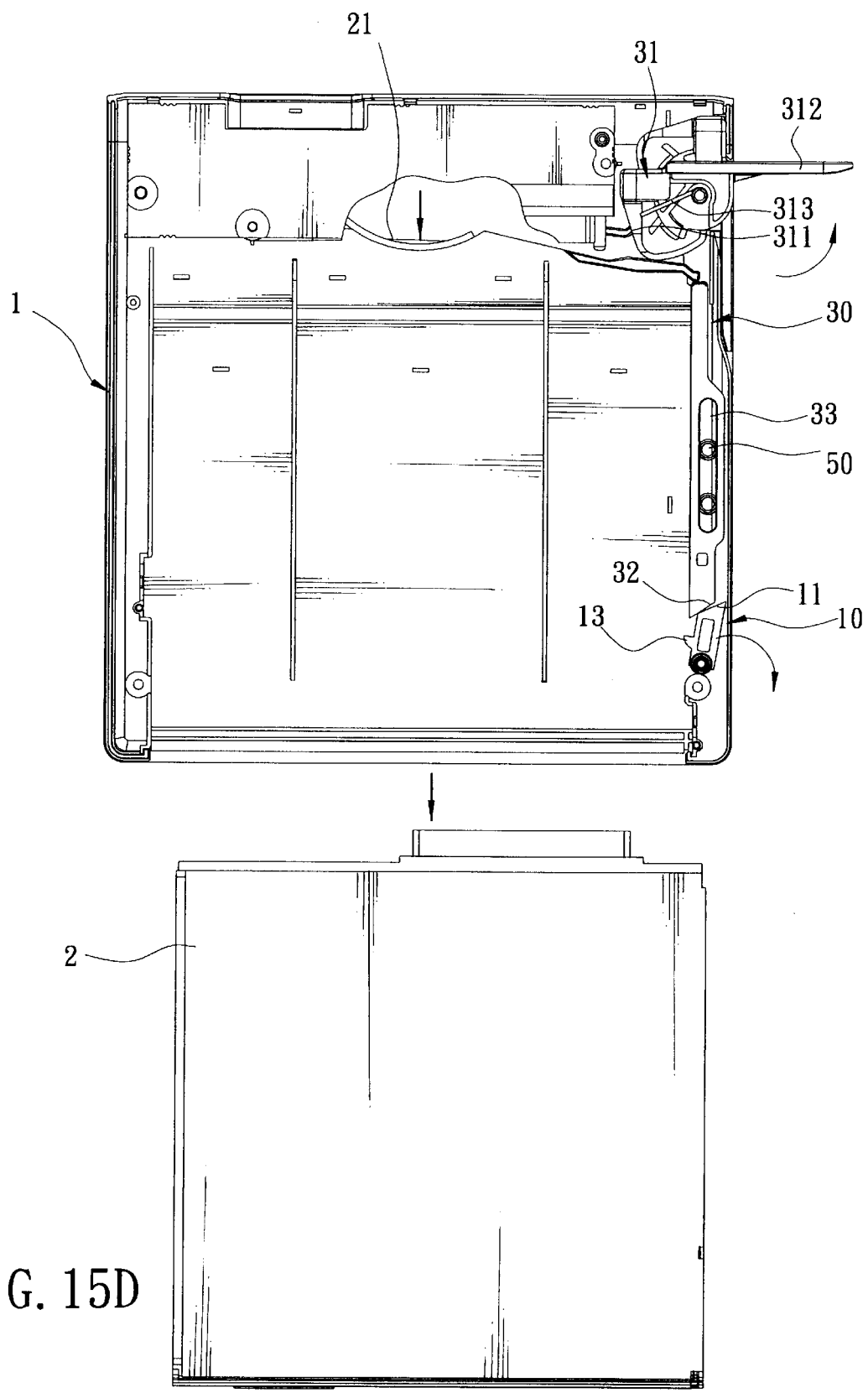

Refer to FIGS. 14 and 15A for a fourth embodiment of the invention. The ejection mechanism is adopted for use in a housing chamber 1 of an electronic device. The housing chamber 1 may be built in the electronic device or externally connected to the electronic device for housing an electronic element 2 (such as a disk drive of various types). The ejection mechanism consists of a latch member 10, a first rod member 20, a second rod member 30 and an ejection member 31 to enable the modular electronic element to be easily removed from the housing chamber of the electronic device for replacement.

The latch member 10 is pivotally located on a lateral side of the housing chamber 1, and includes a torsional element 313, a latch lug 13 and a driven element 14. The torsional element 313 may be a torsional spring and is coupled on the pivotal axis of the latch member 10 such that the latch lug 13 is engaged with the modular electronic element 2 in normal conditions.

The first rod member 20 is movably and pivotally located in the housing chamber 1, corresponds to the modular electronic element 2, and has one end corresponding to other end of the second rod member 30 (the first rod member 20 and the second rod member 30 may be pivotally engaged as shown in FIG. 2, or the first rod member 20 may be bonded to the other end of the second rod member 30 as shown in FIG. 9C). The first rod 20 further has an ejector 21 located on one side thereof. The ejector 21 is an arch-shaped element extending from the first rod member 20 and corresponds to the modular electronic element 2 (the two may contact with each other, or contact with each other during operation).

The second rod member 30 is movably located in the housing chamber 1 corresponding to the latch member 10, forms a linkage relationship with the first rod member 20, and includes a first wedge surface 11, a slot 33 and an elastic element 12. The first wedge surface 11 corresponds to the driven element 14 (the two may contact with each other, or contact with each other during operation) for moving the first rod member 20 through the driven element 14. The slot 33 is an elongated groove for housing a guiding strut 50 to channel and restrict the second rod member 30 to move in a straight direction. The elastic element 12 may be a spring and is adjacent to the latch member 10. The elastic element 12 and the latch member 10 are located on two different and parallel surfaces to enable the second rod member 30 to move back to the location corresponding to where the latch member 10 is located when the latch lug 13 latches on the modular electronic element 2.

The ejection member 31 forms a linkage relationship with the first rod member 20 and the second rod member 30 for driving the second rod member 30 to move the latch member 10 to release the latch member 10 from the modular electronic element 2. The modular electronic element 2 may be ejected from the housing chamber 2 by the first rod member 20. The ejection member 31 is pivotally located in the housing chamber 1, and includes a cam 311, a lever 3 12 extending outside the lateral side of the housing chamber 1 and a torsional element 313. When the latch member 10 engages with the modular electronic element 2, the cam surface of the cam 311 spaced from the cam axis at a longer distance is separate from the first rod member 20, while the cam surface spaced from the cam axis at a shorter distance contacts the first rod member 20. The lever 312 may be moved to eject the modular electronic element 2. The torsional element 313 is located on the axis of the ejection member 31 to move the ejection member 31 back to the location corresponding to where the latch member 10 is located when the latch lug 13 latches on the modular electronic element 2.

Referring to FIGS. 10, 15A, 15B, 15C and 15D, when the invention is in operation, move the lever 312 of the ejection member 31. The ejection member 31 is turned against the torsional force of the torsional element 313, and the cam surface of the cam 311 spaced from the cam axis at a longer distance presses the first rod member 20 and drives the first rod member 20 towards the opening of the housing chamber 1. The ejector 21 pushes the modular electronic element 2 to slip out of the housing chamber 1. Under the constraints of the slot 33 and the guiding strut 50, the second rod member 30 is driven. Meanwhile, the first wedge surface 11 pushes the driven element 14 to turn the latch member 10 against the torsional force of the torsional element 313, and the latch lug 13 is moved away from the modular electronic element 2 to release the latch from the modular electronic element 2. After the ejection member 31 is released, torsional force of the torsional spring 313 turns the latch member 10 to move the latch lug 13 back to the latching position on the modular electronic element 2. Similarly, the first wedge surface 11 pushes the driven element 14, and under the constraints of the slot 33 and the guiding strut 50, the latch member 10 drives the second rod member 30 which in turn drives the first rod member 20 to move together to locations corresponding to where the latch member 10 is located when the latch lug 13 latches on the modular electronic element 2. Meanwhile, the retainer 40 restricts the range of motion of the first rod member 20, and the second rod member 30 is moved back to its original position. The movement of the latch lug 13 is substantially the same as that shown in FIGS. 13A. 13B and 13C previously discussed. When the modular electronic element 2 is inserted into the housing chamber 1, the latch member 10 is compressed by the modular electronic element 2 and turned against the torsional force of the torsional element 313. Once the modular electronic element 2 is completely housed in the housing chamber 1, the latch lug 13 of the latch member 10 latches onto the modular electronic element 2.

By means of the constructions set forth above, the ejection mechanism of the invention can drive and eject a modular electronic element out of a housing chamber with a small force for replacing another modular electronic element. It is easier and more convenient to use.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An ejection mechanism for a modular electronic element located in a housing chamber, comprising:

a latch member movably located on a lateral side of the housing chamber for engaging with the modular electronic element;

a second rod member movably located in the housing chamber corresponding to the latch member;

a first rod member movably located in the housing chamber corresponding to the modular electronic element and forming a linkage relationship with the second rod member; and an ejection member movably located in the housing chamber forming a linkage relationship with the first rod member and the second rod member for driving the second rod member to move the latch member to release the engaging of the latch member to the modular electronic element, and to enable the first rod member to eject the modular electronic element out of the housing chamber;

the latch member having a first wedge surface which has a pointed edge adjacent to a lateral side of the housing chamber, the second rod member having a second wedge surface corresponding to the first wedge surface for the second rod member to drive the latch member.

2. The ejection mechanism for a modular electronic element of claim 1, wherein the first wedge surface contacts the second wedge surface when the latch member is in the normal condition.

3. The ejection mechanism for a modular electronic element of claim 1, wherein the first wedge surface contacts the second wedge surface when the,second rod member drives the latch member.

4. The ejection mechanism for a modular electronic element of claim 1, wherein the latch member has an elastic element located between the latch member and the lateral side of the housing chamber such that the elastic member is compressed when the latch member is driven by the second rod member and the latch member is moved towards the lateral side of the housing chamber to release the modular electronic element.

5. The ejection mechanism for a modular electronic element of claim 4, wherein the elastic element is a spring.

6. The ejection mechanism for a modular electronic element of claim 1 further having a retainer located in the housing chamber on one side of the first rod member opposite the modular electronic element to limit range of motion of the first rod member.

7. The ejection mechanism for a modular electronic element of claim 1, wherein the ejection member corresponds to the first rod member for driving the first rod member towards an opening of the housing chamber to eject the modular electronic element and driving the second rod member to move the latch member to release the modular electronic element.

8. The ejection mechanism for a modular electronic element of claim 3, wherein the ejection member includes a cam and a lever extending outside the lateral side of the housing chamber the ejection member being turnable when the lever is moved to make cam surface which is spaced from the axis of the cam at a longer distance to contact and drive the first rod member.

9. The ejection mechanism for a modular electronic element of claim 8, wherein the ejection member further includes a torsional element coupled on a pivotal axis thereof to allow the ejecting member returning to a location corresponding to where the latch member engaging with the modular electronic element.

10. The ejection mechanism for a modular electronic element of claim 1, wherein the second rod member has an elastic element adjacent to the latch member to allow the second rod member returning to a location corresponding to where the latch member engaging with the modular electronic element.

11. An ejection mechanism for a modular electronic element located in a housing chamber, comprising:

a latch member movably located on a lateral side of the housing chamber for engaging with the modular electronic element in a normal condition;

a second rod member movably located in the housing chamber corresponding to the latch member;

a first rod member movably located in the housing chamber corresponding to the modular electronic element and forming a linkage relationship with the second rod member; and an ejection member movably located in the housing chamber forming a linkage relationship with the first rod member and the second rod member for driving the second rod member to move the latch member to release the engaging of the latch member to the modular electronic element, and to enable the first rod member to eject the modular electronic element out of the housing chamber, the latch member including a driven element, and the second rod member having a first wedge surface corresponding to the driven element for moving the latch member.

12. The ejection mechanism for a modular electronic element of claim 11, wherein the first wedge surface contacts the driven element when the latch member is in the normal condition.

13. The ejection mechanism for a modular electronic element of claim 11, wherein the first wedge surface contacts the driven element when the second rod member drives the latch member.

14. The ejection mechanism for a modular electronic element of claim 11, wherein the latch member has a torsional element coupled on a pivotal axis thereof such that when the latch member engages with the modular electronic element, the second rod member being allowed to drive the latch member against the force of the torsional element to release the modular electronic element.

15. The ejection mechanism for a modular electronic element of claim 14, wherein the torsional element is a torsional spring.

16. The ejection mechanism for a modular electronic element of claim 11, wherein the latch member has a latch lug to engage with the modular electronic element.

17. The ejection mechanism for a modular electronic element of claim 11, wherein the ejection member is located on the second rod member for driving the second rod member.

18. The ejection mechanism for a modular electronic element of claim 17, wherein the second rod member is pivotally engaged with the first rod member.

19. The ejection mechanism for a modular electronic element of claim 18, wherein the ejection member located on the second rod member extends outside the lateral side of the housing chamber.

20. The ejection mechanism for a modular electronic element of claim 19, wherein the torsional element is a torsional spring.

21. An ejection mechanism for a modular electronic element located in a housing chamber, comprising:

a latch member movably located on a lateral side of the housing chamber for engaging with the modular electronic element in a normal condition;

a second rod member movably located in the housing chamber corresponding to the latch member;

a first rod member movably located in the housing chamber corresponding to the modular electronic element and forming a linkage relationship with the second rod member;

an ejection member movably located in the housing chamber forming a linkage relationship with the first rod member and the second rod member for driving the second rod member to move the latch member to release the engaging of the latch member to the modular electronic element, and to enable the first rod member to eject the modular electronic element out of the housing chamber; and a guiding strut, the second rod member having a slot for housing the guiding strut for channeling and restricting moving direction of the second rod member.

22. The ejection mechanism for a modular electronic element of claim 21, wherein the slot is an elongated groove to allow the second rod member moving in a straight line.

23. The ejection mechanism for a modular electronic element of claim 22, wherein the ejector contacts the modular electronic element when the latch member is in the normal condition.

24. The ejection mechanism for a modular electronic element of claim 22, wherein the ejector contacts the modular electronic element when the first rod member moves.

25. The ejection mechanism for a modular electronic element of claim 24, wherein the elastic element is a spring.

26. The ejection mechanism for a modular electronic element of claim 24, wherein the elastic element and the latch member are respectively located on two different and parallel surfaces.

27. The ejection mechanism for a modular electronic element of claim 21, wherein the first rod member has an ejector located on one lateral side thereof, the ejector being formed in an arched shape, extended from the first rod member and corresponding to the modular electronic element.

* * * * *